United States Patent
Beat

(10) Patent No.: US 8,390,319 B2
(45) Date of Patent: Mar. 5, 2013

(54) PROGRAMMABLE LOGIC FABRIC

(75) Inventor: Robert Charles Beat, Bristol (GB)

(73) Assignee: Silicon Basis Ltd, Bristol (GB)

( * ) Notice: Subject to any disclaimer, the term of this patent is extended or adjusted under 35 U.S.C. 154(b) by 60 days.

(21) Appl. No.: 12/919,347

(22) PCT Filed: Feb. 25, 2009

(86) PCT No.: PCT/GB2009/000514
§ 371 (c)(1), (2), (4) Date: Oct. 14, 2010

(87) PCT Pub. No.: WO2009/106814
PCT Pub. Date: Sep. 3, 2009

(65) Prior Publication Data
US 2011/0031999 A1   Feb. 10, 2011

(30) Foreign Application Priority Data
Feb. 27, 2008 (GB) .................................. 0803636.0

(51) Int. Cl.
*H03K 19/173* (2006.01)
*H03K 19/00* (2006.01)
*H03K 19/096* (2006.01)

(52) U.S. Cl. ............................. 326/38; 326/93; 326/96

(58) Field of Classification Search .............. 326/37–47, 326/101, 105, 93–98
See application file for complete search history.

(56) References Cited

U.S. PATENT DOCUMENTS

| | | | |
|---|---|---|---|
| 5,426,378 A | 6/1995 | Ong | |
| 5,646,544 A | 7/1997 | Iadanza | |
| 6,018,559 A | 1/2000 | Azegami et al. | |
| 6,091,263 A | 7/2000 | New et al. | |
| 6,107,821 A | 8/2000 | Kelem et al. | |
| 6,154,049 A | 11/2000 | New | |
| 6,288,566 B1 | 9/2001 | Hanrahan et al. | |
| 7,287,146 B2 | 10/2007 | Inuo et al. | |
| 2003/0122578 A1* | 7/2003 | Masui et al. | 326/39 |
| 2005/0246520 A1* | 11/2005 | Vadi et al. | 713/100 |
| 2005/0248364 A1* | 11/2005 | Vadi et al. | 326/39 |
| 2006/0018144 A1* | 1/2006 | Oikawa et al. | 365/145 |
| 2007/0035330 A1* | 2/2007 | Young | 326/41 |
| 2008/0030226 A1* | 2/2008 | Goodnow et al. | 326/38 |

FOREIGN PATENT DOCUMENTS

| | | |
|---|---|---|
| GB | 2286737 A | 8/1995 |
| GB | 2346240 A | 8/2000 |

* cited by examiner

*Primary Examiner* — Thienvu Tran
(74) *Attorney, Agent, or Firm* — Gifford, Krass, Sprinkle, Anderson & Citkowski, P.C.; Mark D. Schneider

(57) ABSTRACT

A programmable logic circuit comprising a plurality of programmable logic elements and a plurality of programmable interconnect means, and memory means for storing the configuration of the logic elements and interconnect means, wherein said memory means is formed and arranged to store a multiplicity of different configurations for each said logic element.

17 Claims, 29 Drawing Sheets

Standard: average route length 4 logic blocks in 2 steps

TS 4X denser: average route length 2 logic blocks

PROGRAMMABLE LOGIC FABRIC

CROSS-REFERENCE TO RELATED APPLICATIONS

This application is the U.S. national phase of PCT/GB2009/000514 filed Feb. 25, 2009, which claims priority of Great Britain Patent Application 0803636.0 filed Feb. 27, 2008.

The present invention relates to programmable logic circuits In particular, though not exclusively, the invention relates to increasing the density of logic operations which can be carried out in programmable logic circuits.

Programmable logic circuits consist of logic elements (LEs), sometimes alternatively referred to as logic blocks, which can be configured to carry out any logic function and a routing network which can be set up to do any (or the vast majority of) connection between the logic elements. The configuration of the logic element and routing is held in memory, most usually Static Random Access Memory (SRAM), close to the configured circuit.

Field-programmable gate arrays (FPGAs) are a form of programmable logic circuit. An FPGA is a semiconductor device containing programmable LEs and programmable interconnects. LEs can be programmed to perform the function of basic logic gates or more complex arithmetic functions such as adders. In most FPGAs the LEs also include memory elements such as flip-flops and some can be used as a small block of memory. The LEs and interconnects can be programmed by a customer or designer after the FPGA is manufactured, to implement any logical function.

According to a first aspect of the present invention there is provided a programmable logic circuit (PLC) comprising a plurality of programmable logic elements and a plurality of programmable interconnect means, and memory means for storing the configuration of the logic elements and interconnect means, wherein said memory means is formed and arranged to store a multiplicity of different configurations for each said logic element. The memory means is preferably also formed and arranged to store a multiplicity of different configurations for each said interconnect means.

Such a device, when programmed with said different configurations for each logic elements, has the advantage that it increases the density of the logic by time-sharing the fixed resources of the fabric (the logic elements, and preferably also the routing) between multiple configurations. Thus, according to a second aspect of the invention there is provided a programmable logic circuit (PLC) comprising a plurality of logic elements and a plurality of interconnect means, and memory means for storing the configuration of the logic elements and interconnect means, wherein a multiplicity of different configurations for each said logic element are stored in said memory means. Preferably, the memory means also stores a multiplicity of different configurations for each said interconnect means.

In use, commonly an external system clock signal is applied to the whole fabric of the PLC. Preferably, the PLC further includes means for converting a system clock signal applied to the PLC into a modified clock signal. Preferably, said means divides a system clock cycle of the PLC into a predetermined number of sub-cycles. We shall hereinafter refer to these sub-cycles as "fabric cycles" and the modified clock signal as the "fabric" clock signal. Similarly, the means for converting the system clock signal into the fabric clock signal is hereinafter referred to as the fabric clock means.

The PLC may be formed and arranged such that each fabric clock cycle in one system clock cycle is allocated a number, e.g. 0,1,2,3 where the system clock cycle is divided into four fabric cycles. Advantageously, each different stored configuration for a said logic element is associated with a respective fabric cycle number.

Preferably, the PLC is formed and arranged to address the memory means storing the configuration of the logic elements and interconnect means by a fabric phase signal related to the fabric cycle number associated with a particular configuration, in order to read that configuration and configure the associated logic element accordingly for that fabric cycle.

The interconnect means may, for example, comprise interconnect blocks. Preferably, each different stored configuration for a said interconnect block is associated with a respective fabric cycle number and the PLC is formed and arranged to address the memory means storing the configuration of the interconnect blocks by a fabric phase signal related to the fabric cycle number in order to read the configuration of said interconnect block associated with that fabric cycle and configure the interconnect block accordingly for that fabric cycle.

The memory means storing the configurations of the logic elements and interconnect blocks may comprise static configuration memory. Additionally, the memory means may further include decoders.

The logic elements may conveniently comprise Look Up Tables (LUTs). A LUT is basically a small memory where the addresses act as inputs and the data out provides the logic output. Thus, a 4 input, 1 output LUT (4:1 LUT) is actually a 16 entry, 1 bit wide memory. In the timeshared scheme of the present invention, the LUTs in the system preferably have a storage memory with an entry for each fabric cycle that provides the LUT configuration for that fabric cycle.

It will be appreciated that logic defined in each fabric cycle needs to be able to send its output to any other fabric cycle. Where an input for a particular LUT is not provided by the immediately preceding fabric cycle and the input in question is needed by another LUT in an intervening fabric cycle, extra storage means must therefore be provided to store the value until it is required. Thus, for this purpose the PLC preferably further includes buffer means which may, for example, be in the form of one or more extra storage registers, per LUT.

The fabric clock means preferably comprises a multiplicity of clock nodes which are distributed across the fabric of the PLC, for example using mesh-enabled oscillation.

Optionally, the PLC may conveniently be configured such that the fabric clock means is used as a power saving mechanism. For example, a low voltage signalling scheme such as Low Voltage Swing (LVS) may be used.

According to a third aspect of the invention there is provided a method of operating a programmable logic circuit (PLC) comprising a plurality of logic elements and a plurality of interconnect means, and memory means for storing the configuration of the logic elements and interconnects, wherein the method comprises storing a multiplicity of different configurations for each said logic element in said memory means. Preferably, a multiplicity of different configurations for each said interconnect means are also stored in said memory means.

Preferred embodiments of the invention will now be described in detail, by way of example only and with reference to the accompanying drawings in which.

Figure 19A:
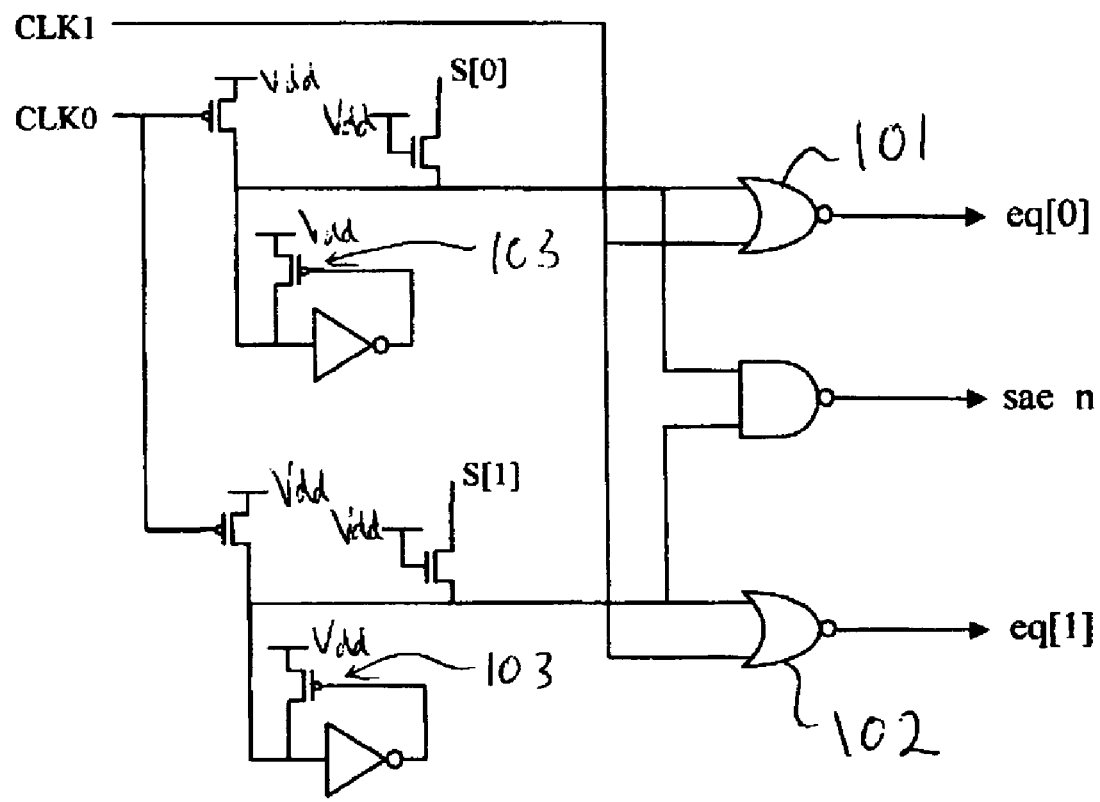
Figure 19B:
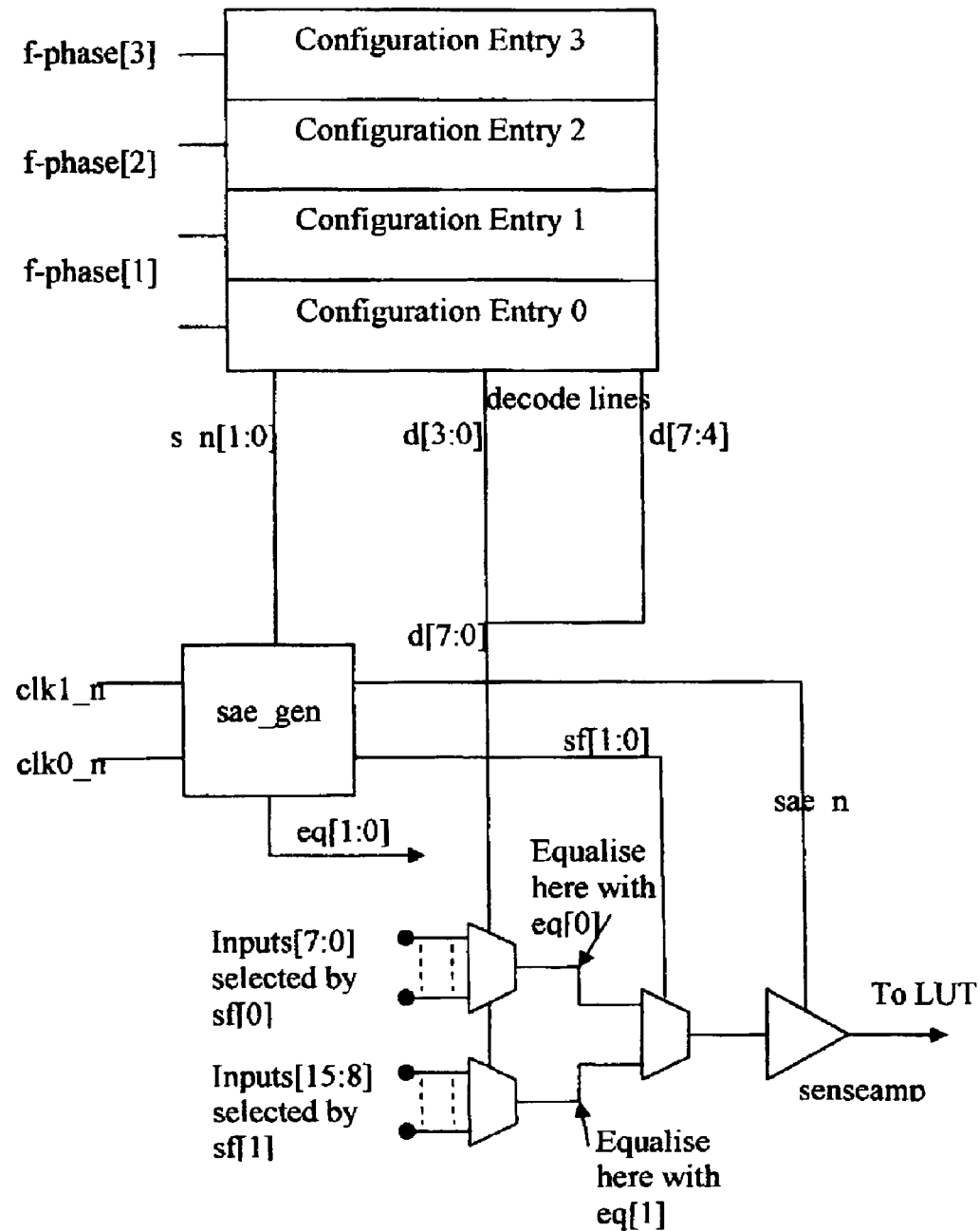
Figure 20:
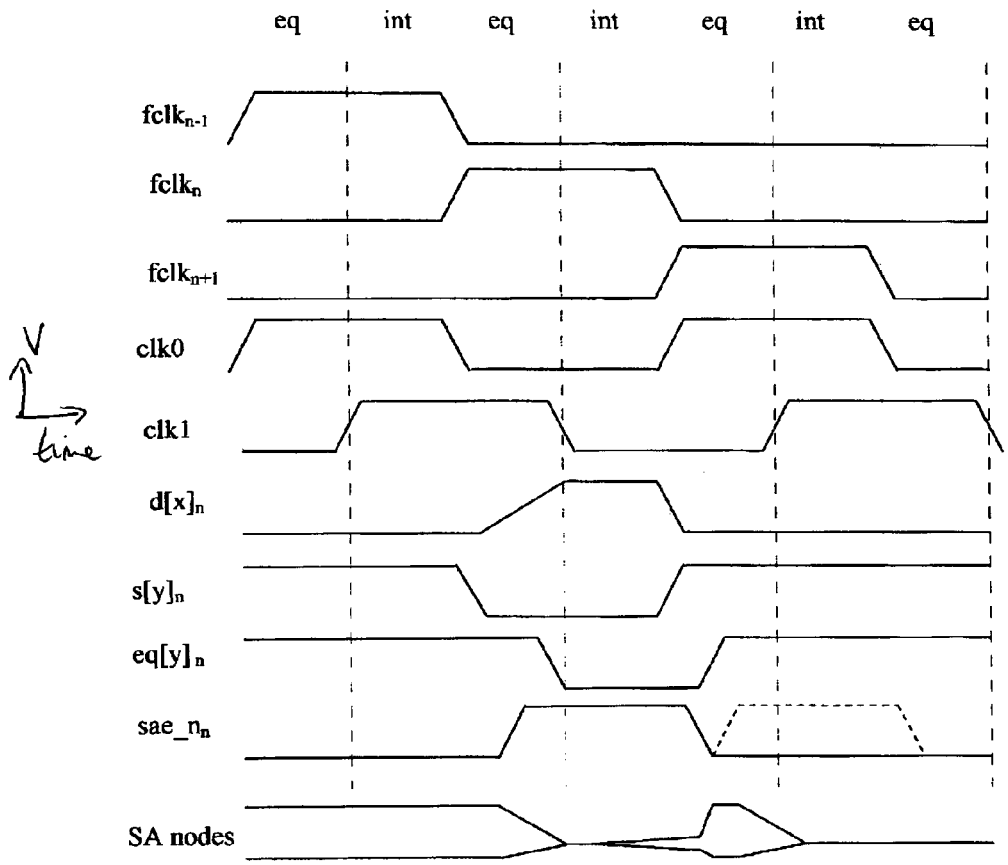
Figure 22A:
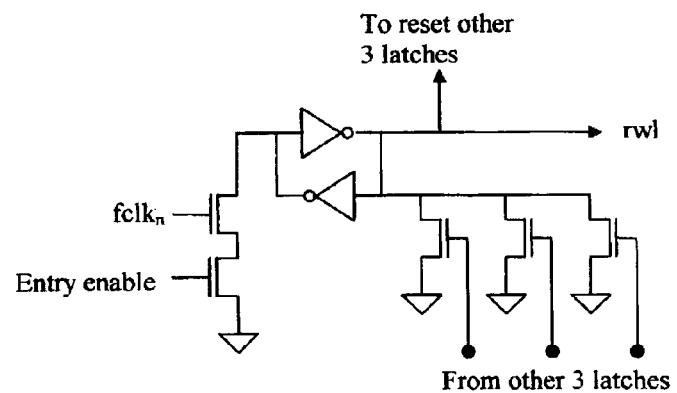
Figure 22B:
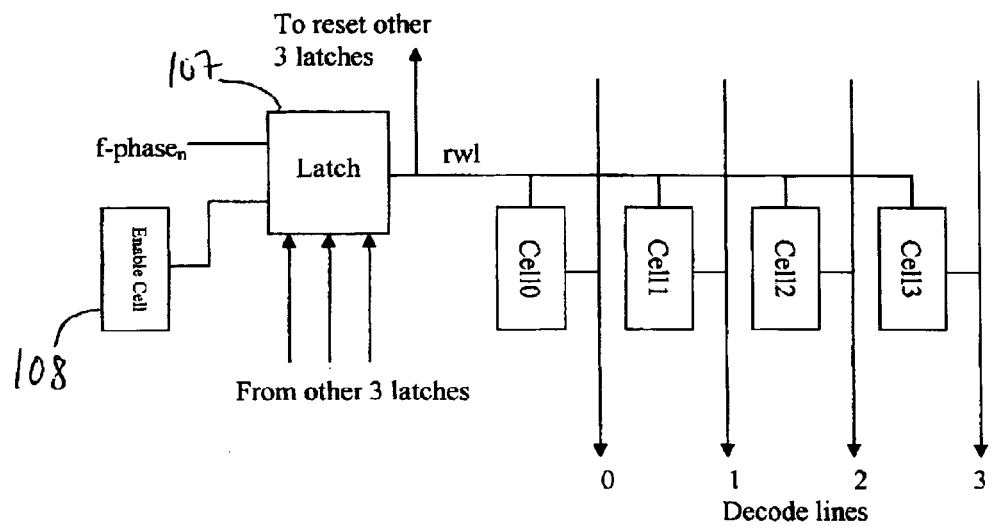
Figure 21:
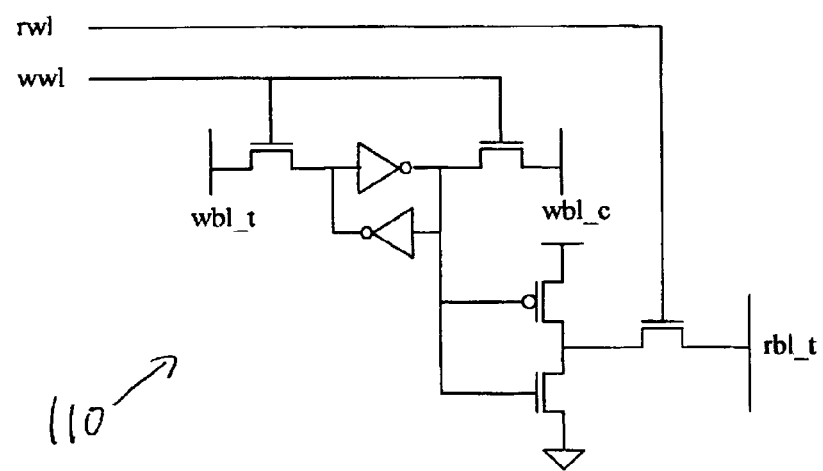
Figure 23A:
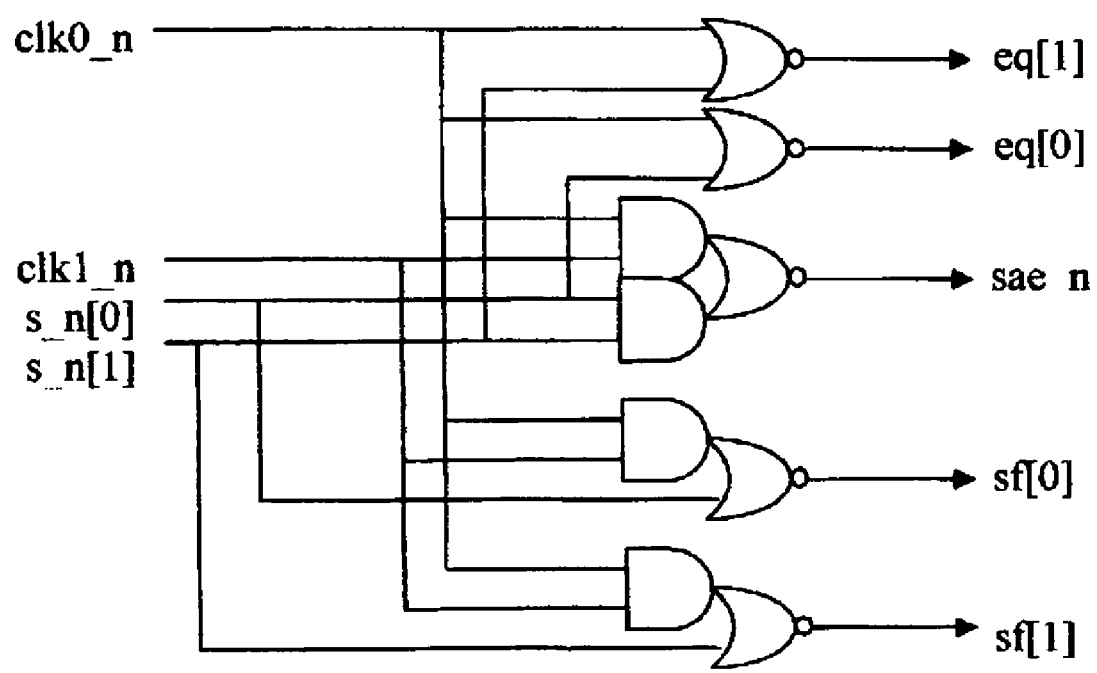
Figure 23B:
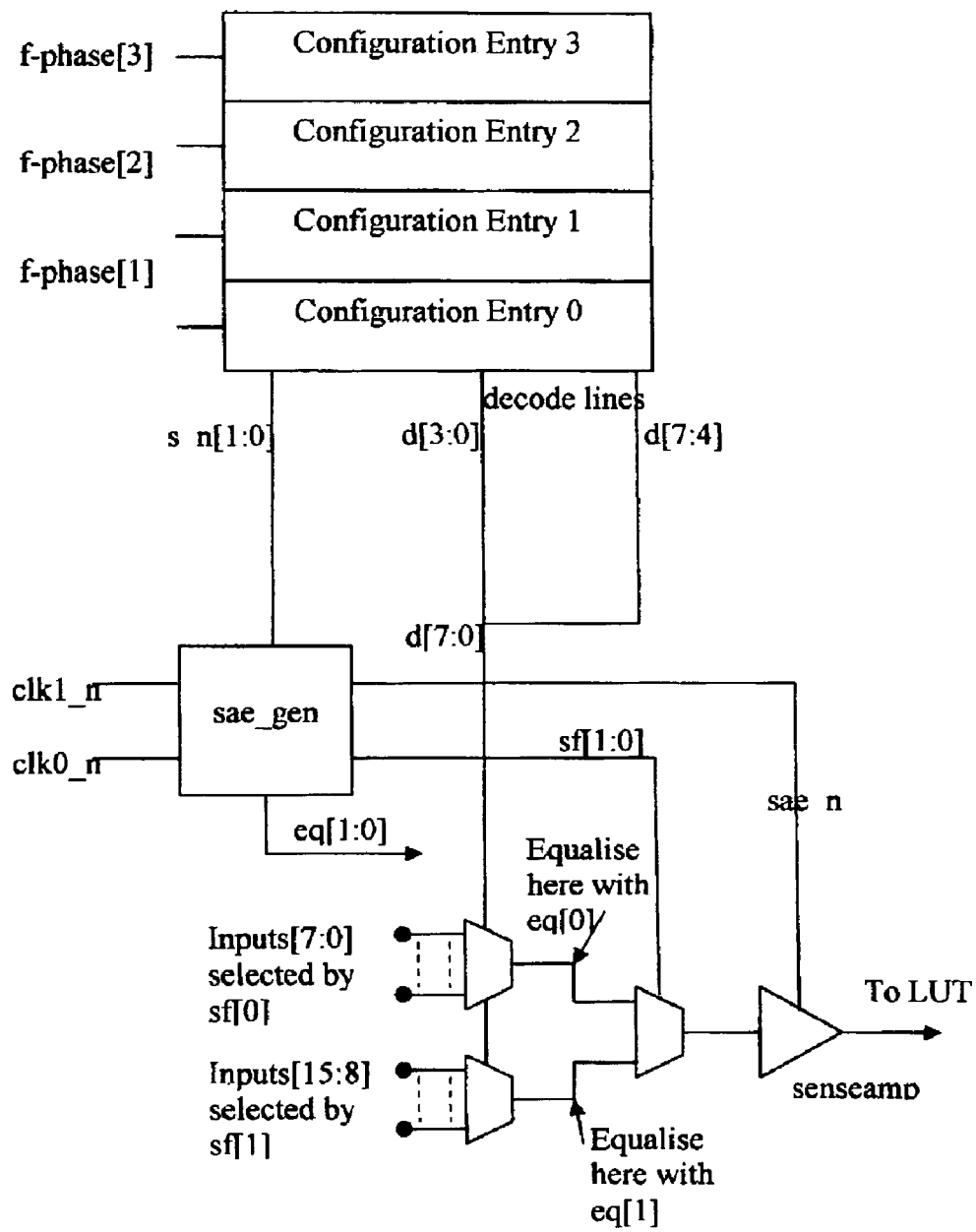
Figure 24:
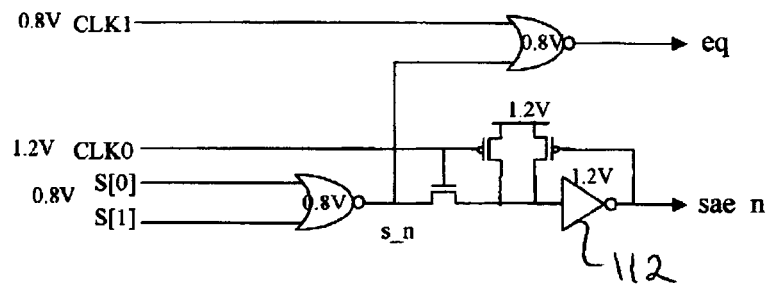
Figure 25:
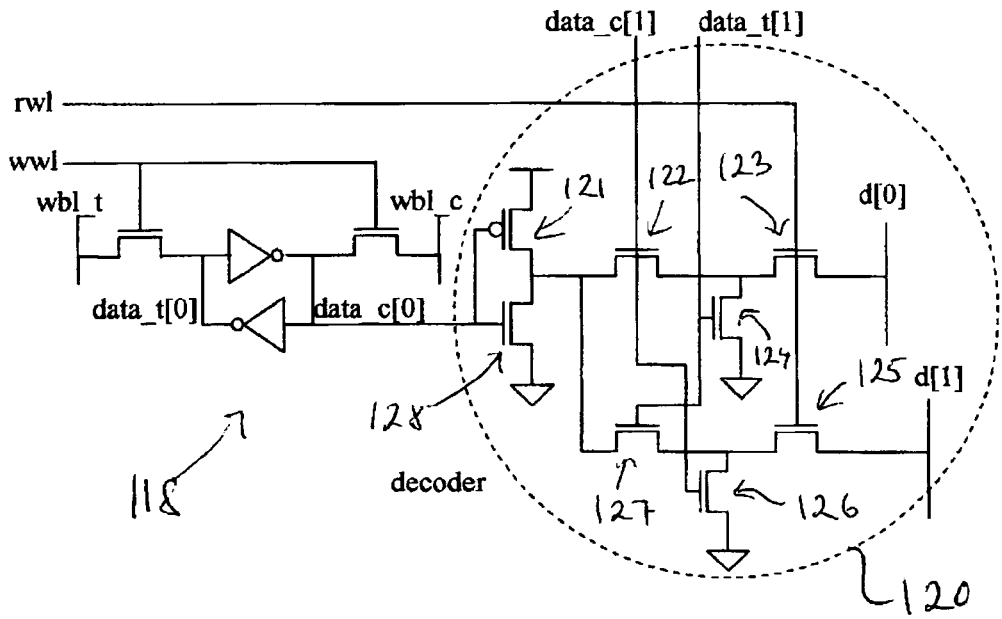
Figure 26:
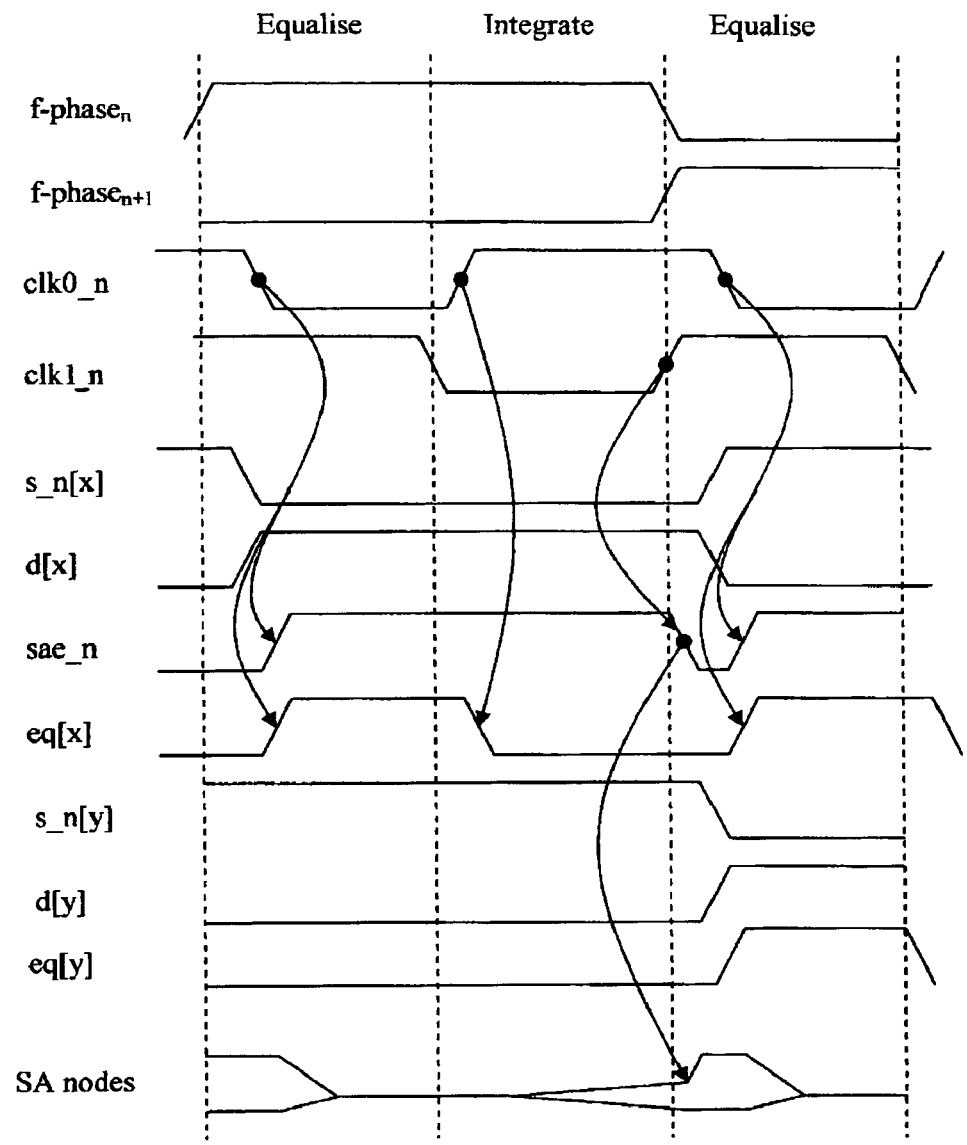
Figure 27:
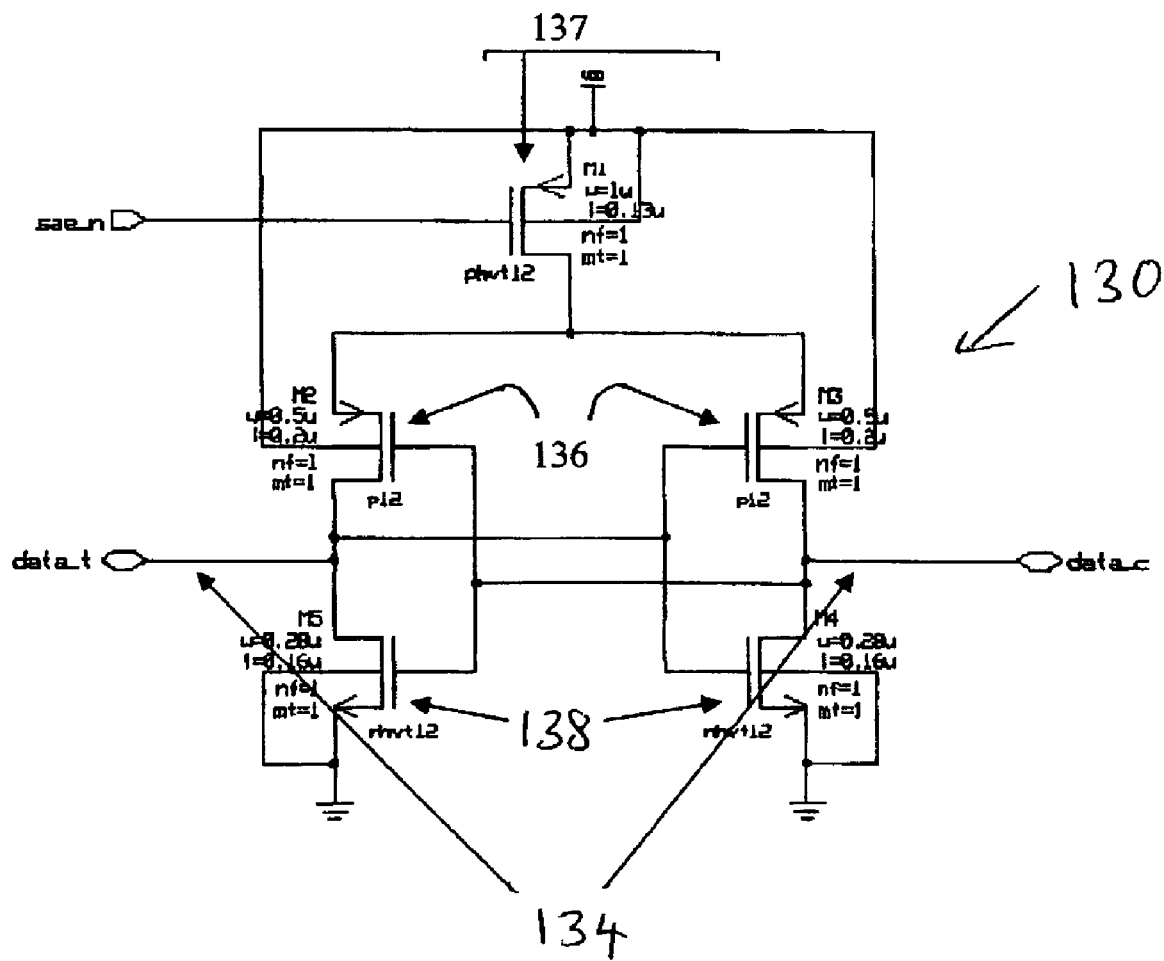
Figure 28:
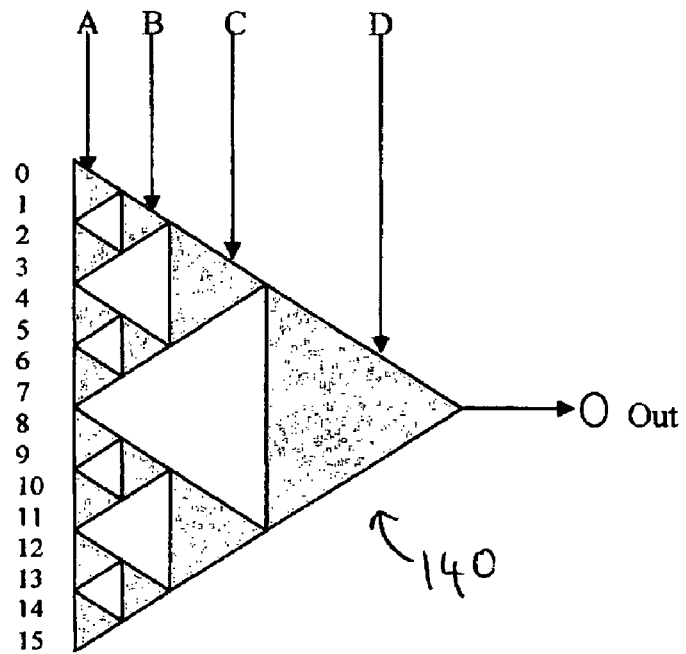
Figure 29:
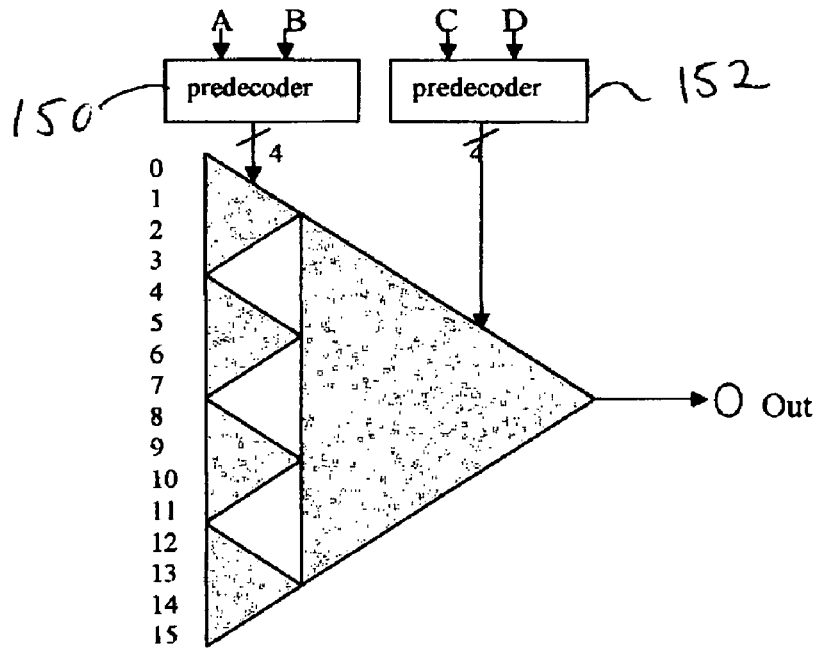
Figure 30:
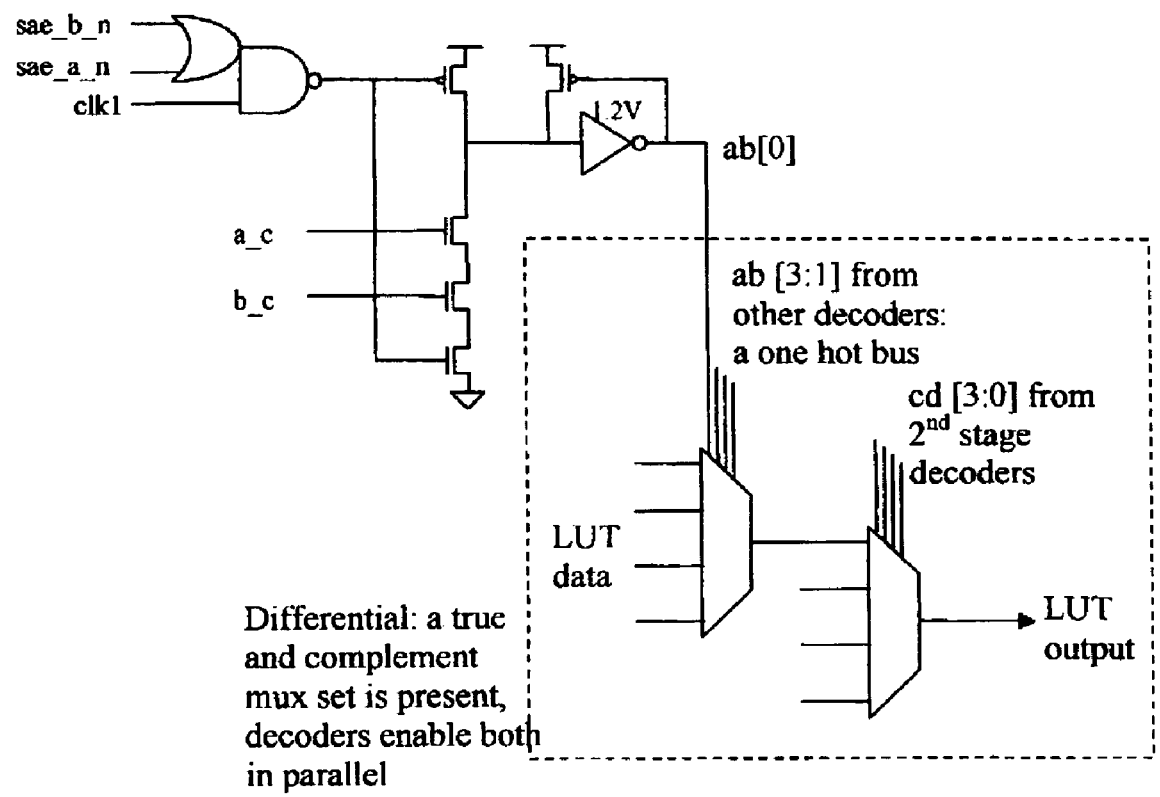
Figure 31:
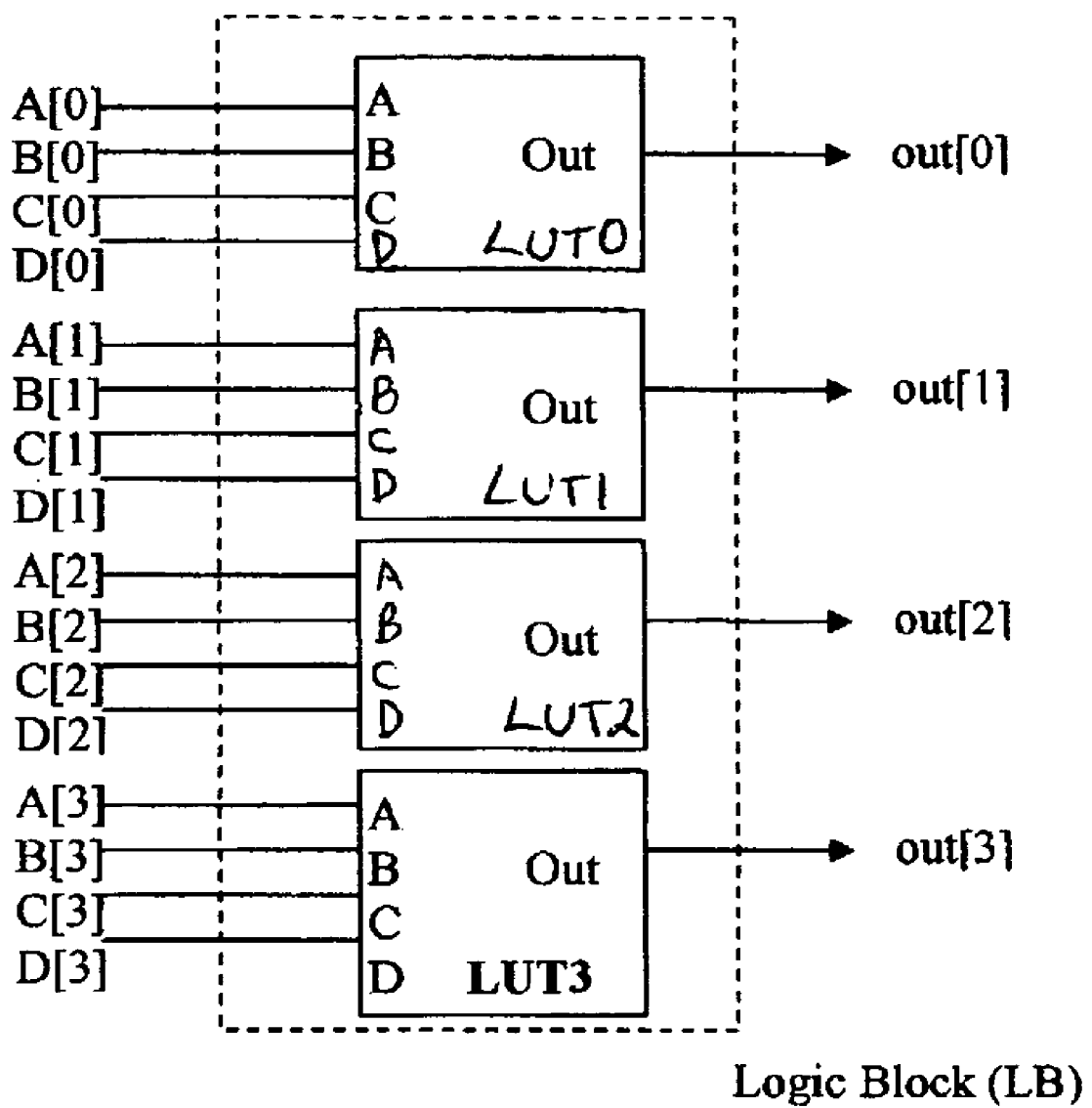
Figure 32:
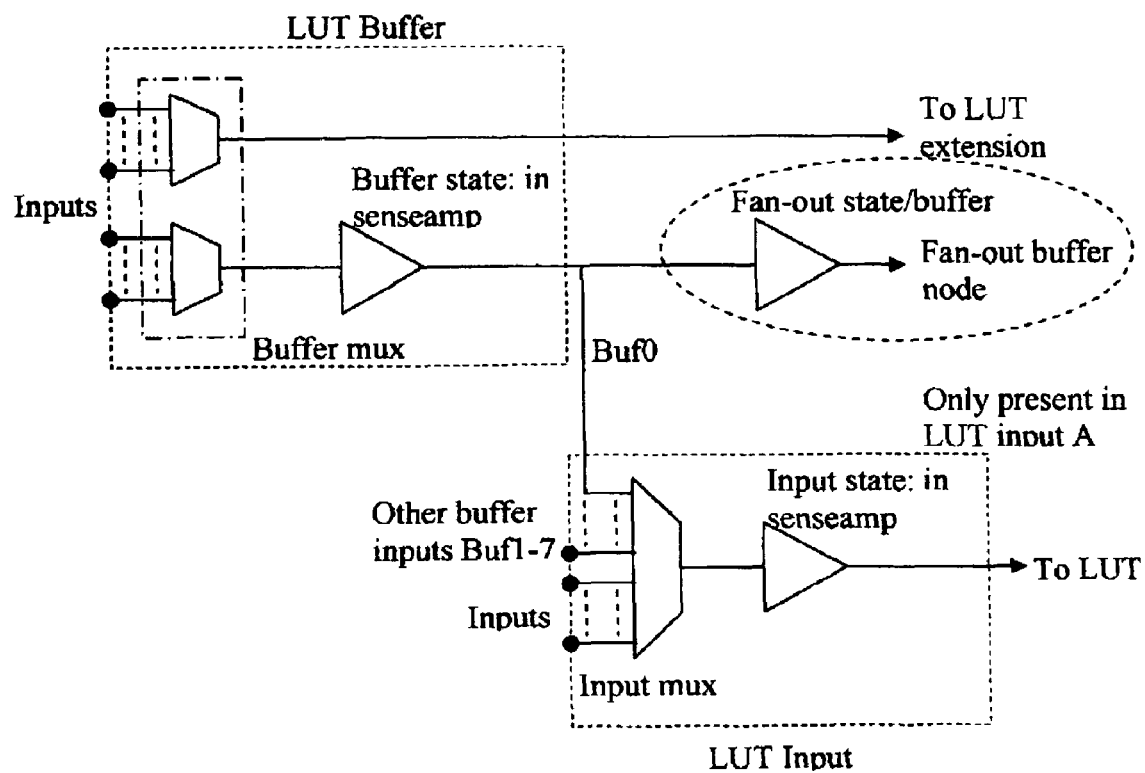
Figure 33:
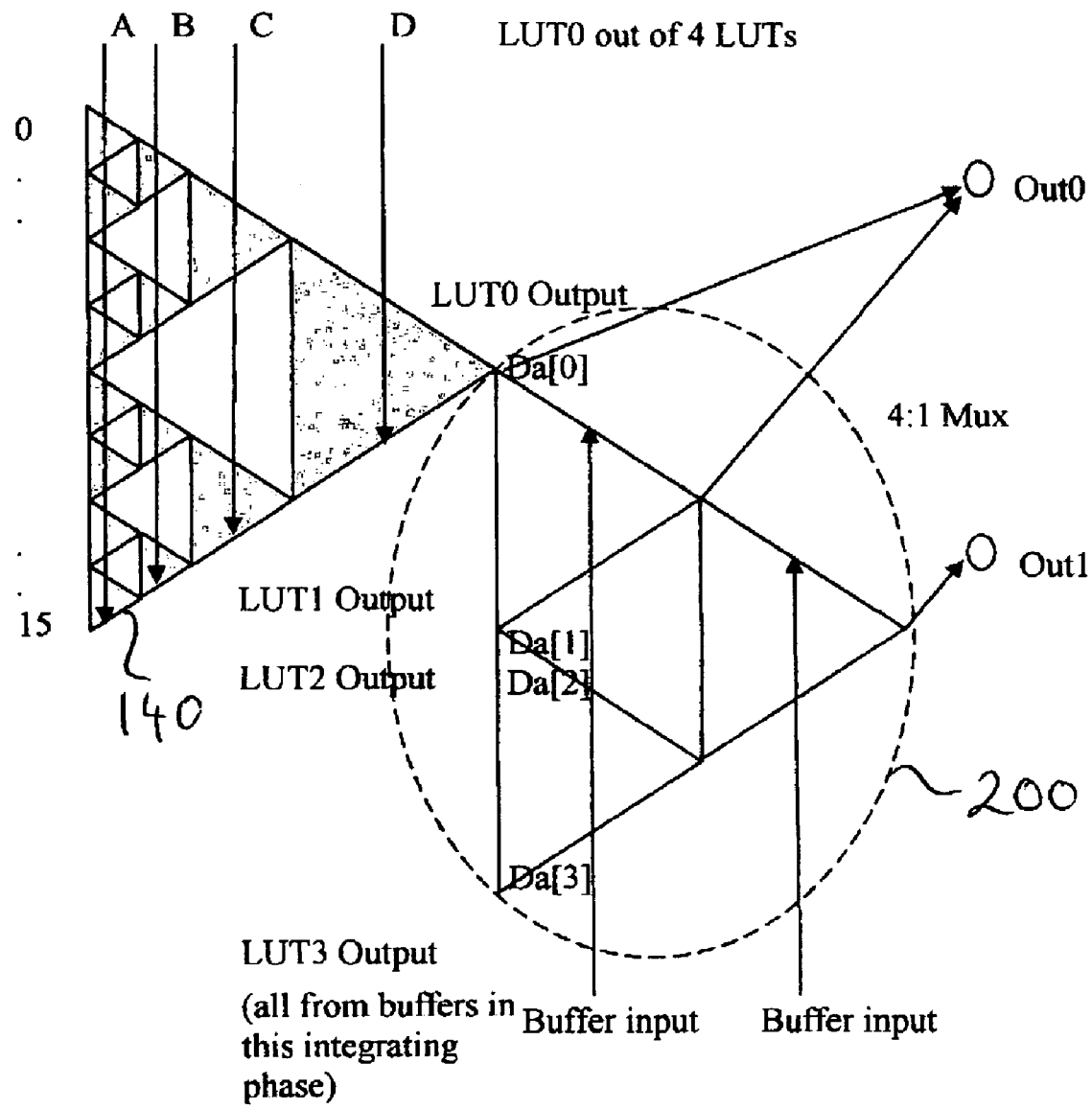
Figure 34:
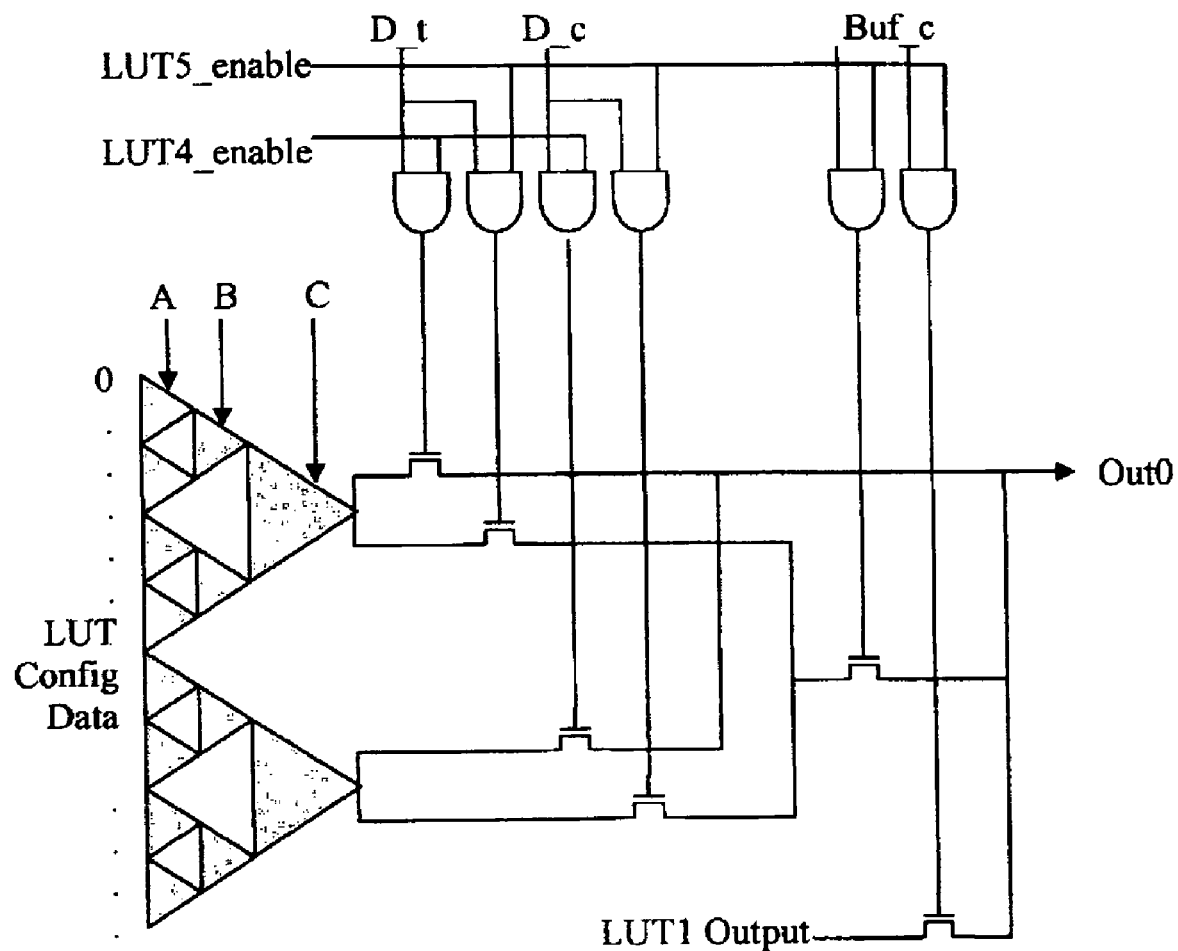
Figure 35:
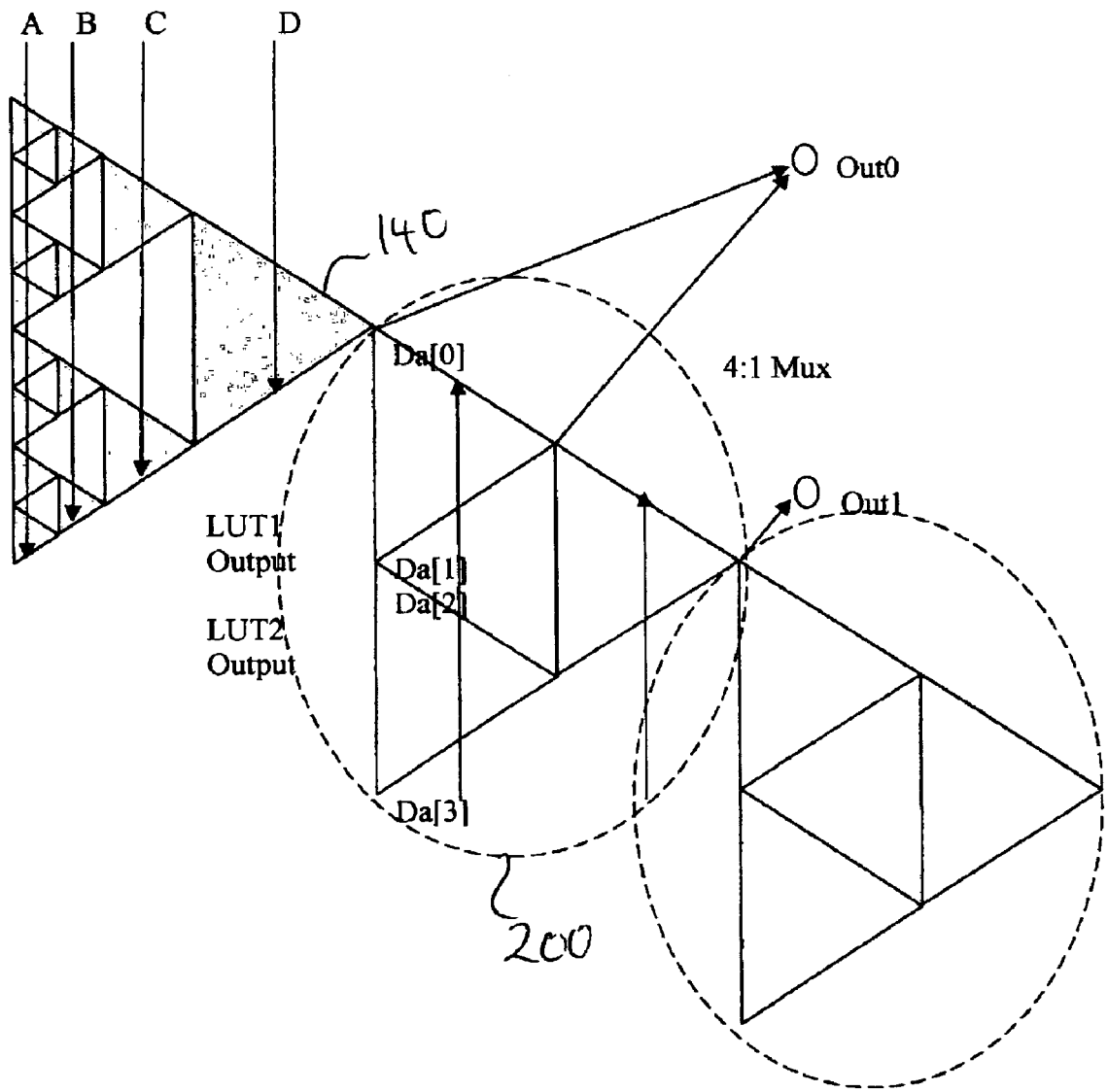

FIG. 19(a) a diagram of a circuit used to generate an active low sense amp enable signal (sae_gen);

FIG. 19(b) is a top level diagram of an input configuration memory;

FIG. 20 is a timing diagram of various control signals in volts plotted against time, in a four phase routing scheme;

FIG. 21 is a diagram of a configuration memory cell in an embodiment employing a static configuration memory;

FIG. 22(a) a diagram of a four entry mux-mem used in conjunction with the static configuration memory of FIG. 21;

FIG. 22(b) is a diagram of a static configuration memory entry circuit;

FIG. 23(a) is a modified version of the sae_gen circuit of FIG. 19(a), adapted for use with the static configuration memory of FIG. 21;

FIG. 23(b) is a top-level diagram of a static input configuration memory;

FIG. 24 is a diagram illustrating a power saving version of the circuit of FIG. 23(a);

FIG. 25 is a diagram of a static, decoded data cell;

FIG. 26 shows graphs illustrating the timing of a static circuit in a two-phase implantation, plotted as various signals (in Volts), against time;

FIG. 27 is a diagram of a Senseamp (SA) for use in the invention;

FIG. 28 illustrates a Low Voltage Differential Swing (LVDS) scheme of an LUT4;

FIG. 29 illustrates an alternative possible circuit architecture to the circuit of FIG. 28, utilising a decoder;

FIG. 30 is a diagram of a LUT decoder circuit;

FIG. 31 is a diagram of an LUT arrangement within a logic block, in a four phase routing scheme;

FIG. 32 is a diagram of a buffer architecture used in the invention;

FIG. 33 is a schematic diagram of an Extended Lookup Table;

FIG. 34 is a diagram illustrating LUT output selection in the Extended Lookup Table of FIG. 33; and FIG. 35 is a diagram of a multi-level Extended Lookup Table.

OVERVIEW

A basic architecture of a programmable logic circuit such as a Field Programmable Gate Array (FPGA) consists of an array of configurable logic elements or blocks (LBs) and routing channels. A classic FPGA logic block consists of a four-input lookup table (LUT) and a flip-flop. The logic block has four inputs for the LUT and also a clock signal input to the flip-flop. The routing channels often include programmable interconnect blocks. Configuration data stored as configuration bits in memory cells (for example an SRAM cell) in the FPGA define the logical operation of the LBs and the routing connections there between. The FPGA manufacturer or a customer/designer can program the FPGA, usually using proprietary "place-and-route" software created by the FPGA manufacturer.

The present invention increases the density of the logic in a programmable logic circuit by time-sharing the fixed resources of the fabric (the logic elements and the routing) between multiple configurations. Key points of the architecture include:

1) In use, a system clock signal is commonly applied to the whole fabric or a sub-section of a programmable logic circuit. In the present invention, each system clock cycle is divided into a set number of sub-cycles referred to as "fabric cycles". Each fabric clock cycle in one system clock cycle is allocated a number e.g. 0,1,2,3 where the system clock cycle is divided into four fabric cycles;

2) Instead of having a single set of configuration bits that define logical operation and connectivity of the programmable logic circuit, a multiplicity of different configurations are defined in memories (hereinafter referred to as "configuration memories") that are addressed by fabric phase (also referred to herein as "f-phase") signals, related to the fabric cycle number within the system cycle (the f-phase signals are described in more detail later);

3) Logic defined in each fabric cycle must be able to send its output to any other fabric cycle.

Figure 1:
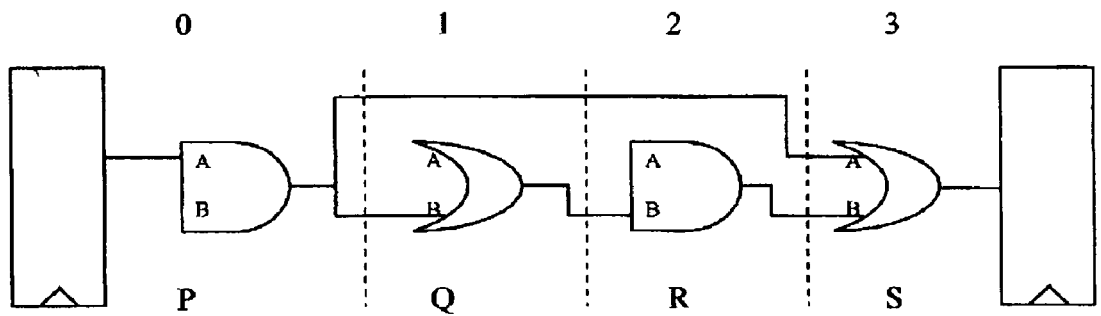
FIG. 1 is a diagram of an example pipe stage circuit incorporating four gate devices.

For example, in the circuit of FIG. 1 time sharing (in accordance with the present invention) enables all four gates P,Q,R,S in the circuit to be contained within one logic element, obviously saving area but also power, because the routes between the logic elements are reduced.

The number of fabric cycles in the system cycle defines the degree of time-sharing within the system. This is called the time share value (TSV). The FIG. 1 example circuit has a TSV of 4. Typical architectures will in practice have a higher TSV e.g. 8 or 16 are the most probable numbers.

The Input Buffers

Where an input to a gate held in a configuration of a logic element is not provided by the preceding fabric cycle and the input in question is needed by another gate in an intervening cycle, extra state must be provided to store the value until it is required. These extra storage registers are called buffers: the number of buffers provided per input is a critical aspect of the architecture. The buffer chosen to drive an input is multiplexed onto the input in the fabric cycle (hereinafter sometimes referred to as the "f-cycle") in which it is required.

For example, the connection from gate P to gate S in FIG. 1 is implemented by buffering the value at the end of fabric cycle P and accessing the value in the buffer at the beginning of fabric cycle S.

Figure 2:
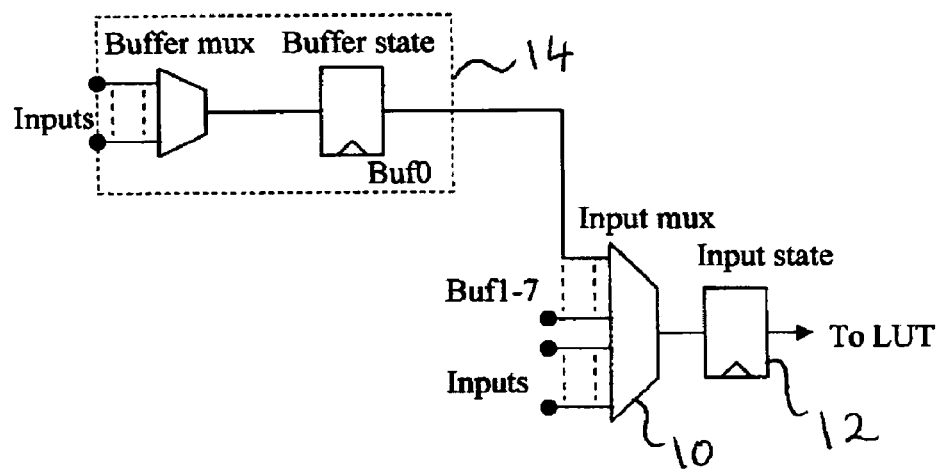
FIG. 2 is a diagram of an input circuit according to one embodiment of the invention.

FIG. 2 shows the general construction of an input to a logic element. The input mux 10 selects which route to obtain the input from in a particular cycle. The value is captured in the input state storage element 12. If the input is forwarded from an f-cycle before the preceding f-cycle, it will come from one of the eight buffers Buf0-7 (only one 14 of which is illustrated in detail in FIG. 2) and that buffer is selected instead.

System Cycle Boundaries

Figure 3:
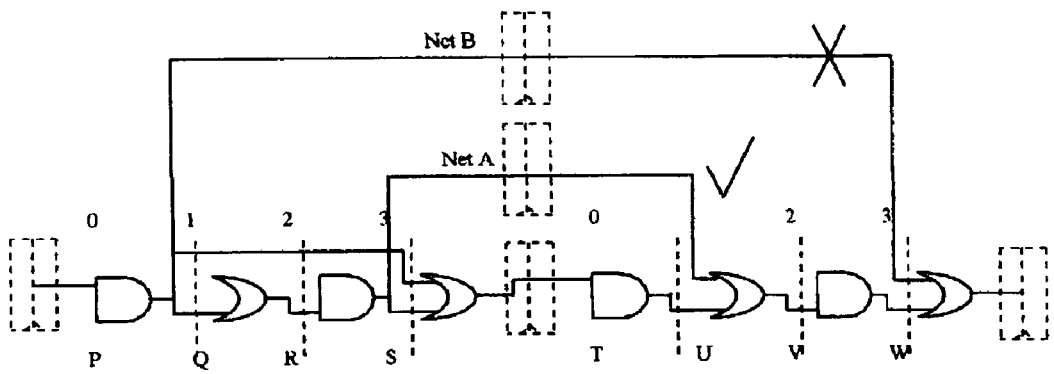
FIG. 3 is a diagram of a pipelined two cycle example circuit.

Let us consider a pipelined two cycle example as shown in FIG. 3, with TSV=4. Let us assume the pipeline is fully loaded: in cycle n gates P,Q,R,S operate on data set N, in cycle n+1 gates T,U,V,W operate on data set n and gates P,Q,R, S on data set N+1 etc.

Again, let us assume that all four gates in each cycle are mapped to the same LE: gates P/Q/R/S to LE1 (not shown) and T/U/V/W to LE2 (not shown).

The fabric cycles (f-cycles) are counted 0 to TSV−1 and wrap back to 0 after TSV−1. The system cycle clock edge occurs on the f-cycle clock edge when the count wraps back to 0.

There are no explicit registers in the system: state storage is facilitated in the input or buffer state registers. In the ticked connection in FIG. 3, Net A is not registered on the system clock boundary, but its value is stored in LE2s f-cycle 1 input or alternatively in a buffer that can be accessed by LE2.

There are restrictions: Net B is attempting to connect from gate P in f-cycle 0 to gate W in f-cycle 3.

However, if we attempt to store Net B in LE2s f-cycle 3 input, it will be picked up in the current cycle of the next pipe stage e.g. data set N−1 instead of the desired data set N. This raises a rule: you cannot connect more than TSV f-cycles ahead.

The net B connection is implemented by buffering the value.

The LUTs

Figure 4A:
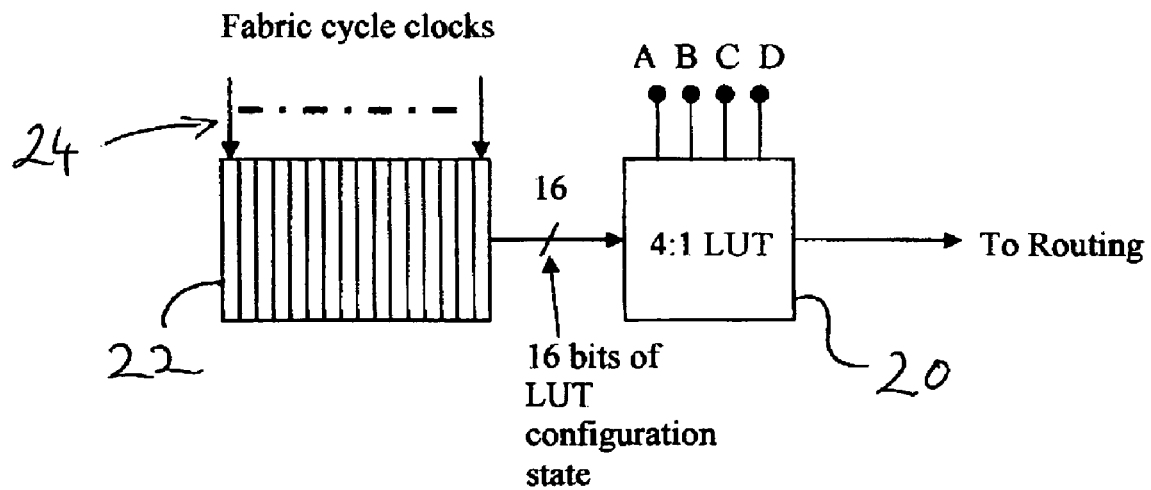
FIG. 4(a) is a diagram of a time shared Lookup Table (LUT)

FPGA architectures are built around configurable logic: logic that can be programmed to perform any possible logic function on a given set of inputs. Lookup tables (LUTs) are a common and popular form of configurable logic element. A LUT is basically a small memory where the addresses act as inputs and the data out provides the logic output. Thus, a four input A,B,C,D, one output LUT (4:1 LUT) 20, as shown in the circuit of FIG. 4(a), is actually a 16 entry, 1 bit wide memory.

In our timeshared scheme, the LUTs in the system have a storage memory 22 (hereinafter referred to as the "configuration memory" 22) with an entry for each fabric cycle that provides the LUT configuration for that cycle. Fabric phase signals 24 (related to the fabric cycle number) control which entry is read from to configure the LUT in that cycle.

The operation of the time shared LUT can be pipelined i.e. the configuration memory 22 can be read in the fabric cycle preceding the fabric it is required to configure the LUT 20. Another way is to use a two or four phase logic scheme. For a two phase scheme the configuration memory 22 is being read in phase A ready to provide the configuration data in phase B (see the section later below describing two and four phase routing).

Time Shared Inputs

Figure 4B:
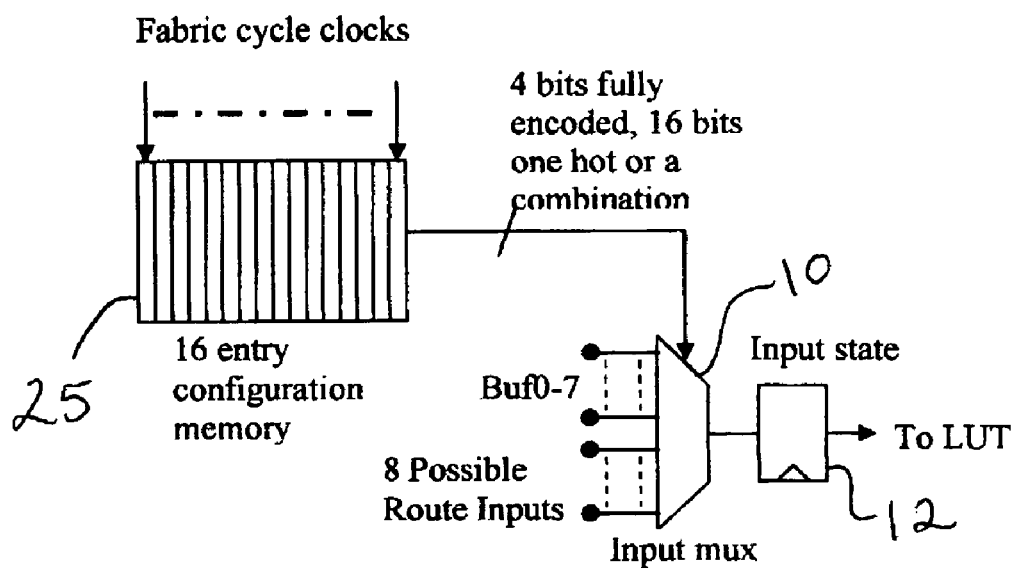
FIG. 4(b) is a diagram illustrating time sharing of LUT inputs and buffer inputs by controlling the selection signals of the input multiplexer of an LUT.

The inputs to the LUT 20 and inputs to the buffers Buf0-7 are also time shared. This is achieved by controlling the selection signals of the input mux 10 from a configuration memory 25, as illustrated in FIG. 4(b).

The width of the configuration memory 25 depends on the needs of the input mux 10 e.g. one hot, fully encoded or a combination or multistage (for example a 2 level tree of 4:1 muxes).

The Logic Blocks

FPGA architectures often group LUTs into blocks. Within these blocks the LUTs are highly interconnected. Let us define a logic block (LB) to consist of 4, 4 input LUTs numbered 0 to 3.

Routing

Figure 5:
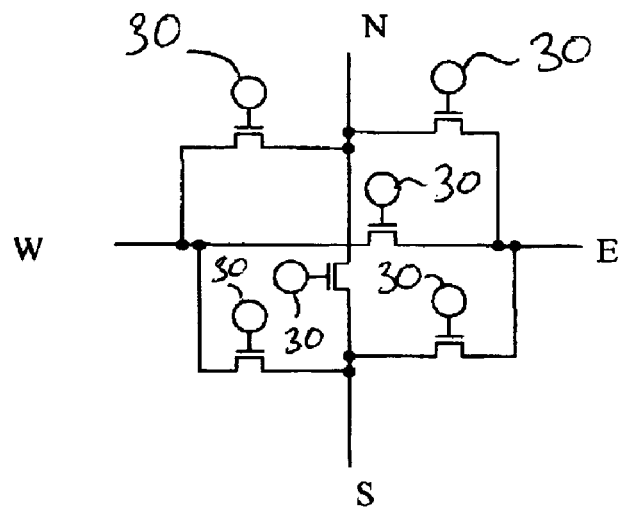
FIG. 5 is a diagram of a traditional programmable interconnect block.

Routing is also time shared. In a traditional segmented FPGA routing scheme, programmable interconnect blocks are where the connectivity of the routes is defined. In the traditional programmable interconnect block shown in FIG. 5, six memory cells 30 are required to define all possible connections between the manhattan routes (North N, East E, South S, West W). FIG. 5 shows a routing architecture using pass transistors. This allows signals to flow in either direction down the wire. A bi-directional buffered architecture could alternatively be used.

Figure 6:
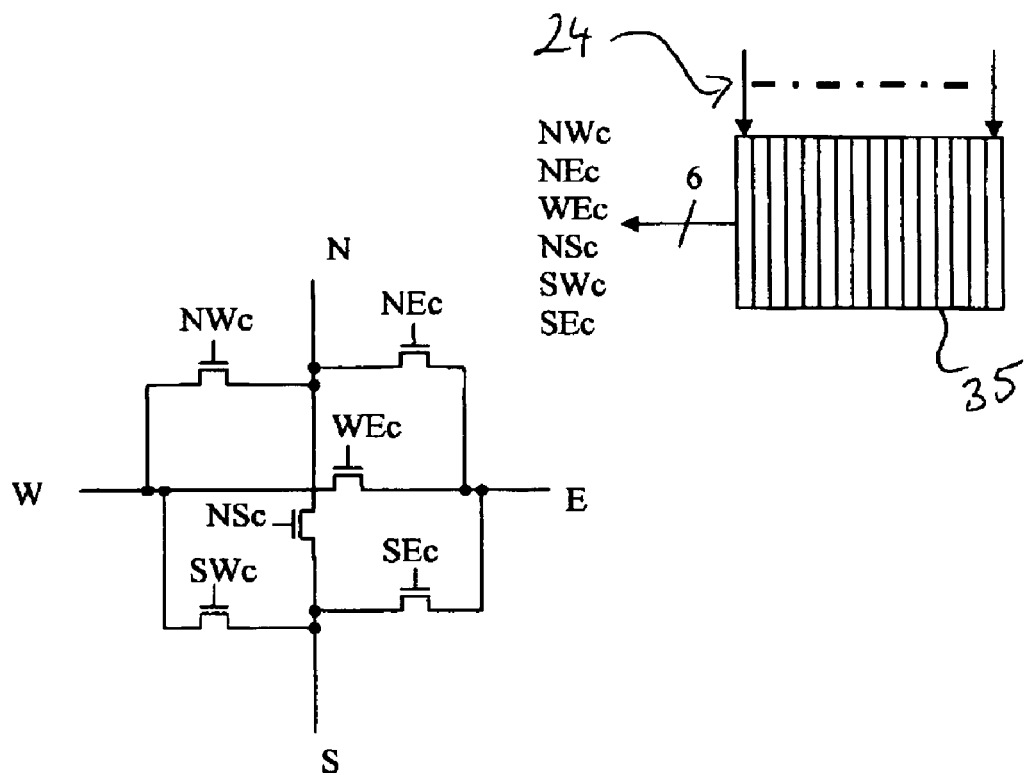
FIG. 6 is a diagram of a time shared programmable interconnect block according to one embodiment of the invention.

To convert the scheme of FIG. 5 into a time-shared architecture, a configuration memory 35 with TSV entries NWc, NEc,WEc,NSc,SWc,SEc must replace the memory cells. This is illustrated in FIG. 6. Again, access of the configuration memory 35 can be pipelined with the operation of the routing.

Figure 7:
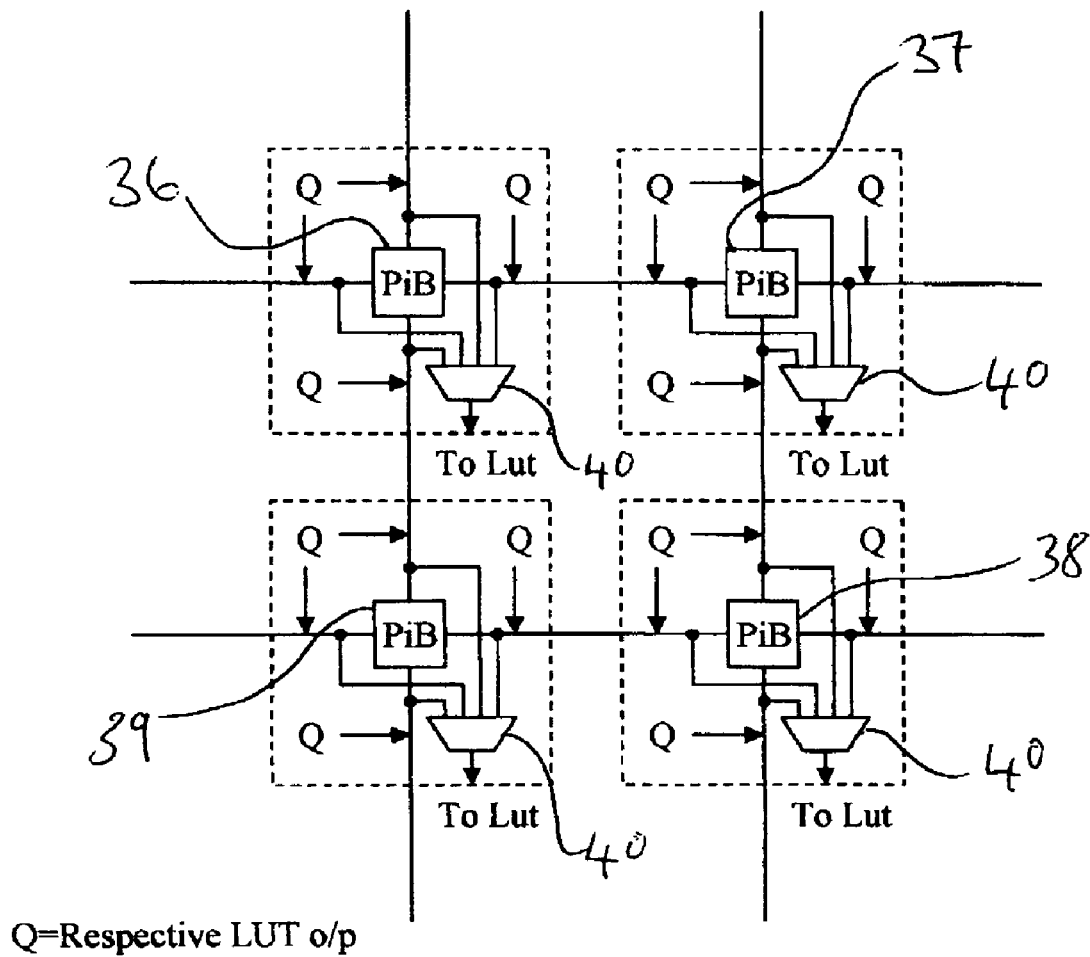
FIG. 7 is a diagram illustrating a possible routing hierarchy in an interconnect block.

The routes must also be able to connect to LUT inputs and the LUT outputs must also be able to connect to the routes. FIG. 7 shows such an arrangement incorporating four programmable interconnect blocks (PiBs) 36,37,38,39. Here:

Q=Respective LUT output (o/p);

Multiplexers 40—muxes—are used to select particular routes for a LUT input.

Routing is often split into hierarchies to connect short (e.g. one logic block apart) or long (e.g. six logic blocks apart). The FIG. 7 diagram shows a single hierarchy or set interconnecting together. Multiple route-sets could be used in the way listed in Table 1 below:

TABLE 1

| | No of Route-sets per LB | No of tracks |
|---|---|---|
| By1 | 8 | 8 |
| By2 | 2 | 4 |
| By6 | 2 | 12 |
| Total | 12 | 24 |

Further connections are provided between the routing hierarchies e.g. by1 connecting to by2 or by6 routes.

In order to limit the size (width) of the LUT input muxes 10, the number of routes they connect to is limited. The available routes can be spread over the four inputs A,B,C,D in the LUT so that as many routes as possible can reach available LUTs.

Clocking

The system clock signal (hereinafter also referred to simply as the "system clock") has to be driven across the whole fabric of the programmable logic circuit. The fabric clock signal (hereinafter also referred to simply as the "fabric clock") also has to be driven synchronously across the whole fabric of the programmable logic circuit. Such a clock has to have a high frequency e.g. a typical system clock of 125 Mhz on an architecture with TS value of 16 gives a fabric clock of 2 Ghz. Distributing high frequency clocks with low skew over a large chip is possible, but difficult.

Figure 8A:
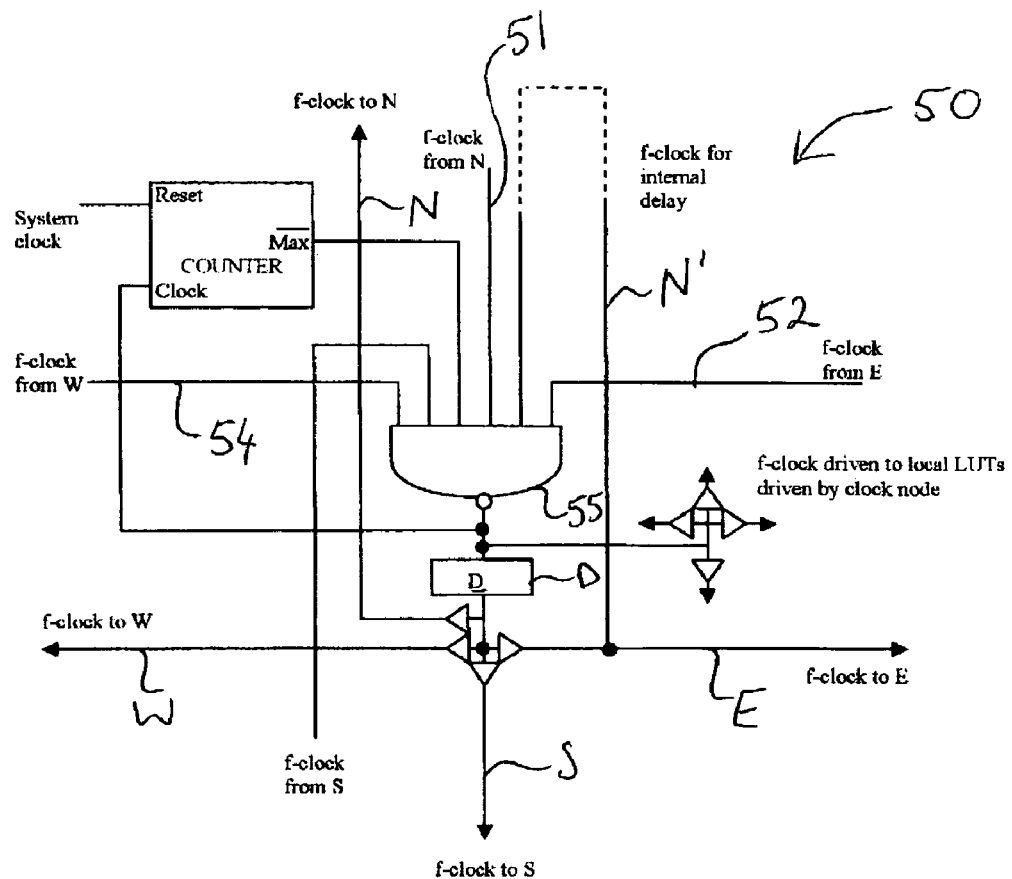
FIG. 8(a) is a diagram of a clock node utilised in the invention.
Figure 8B:
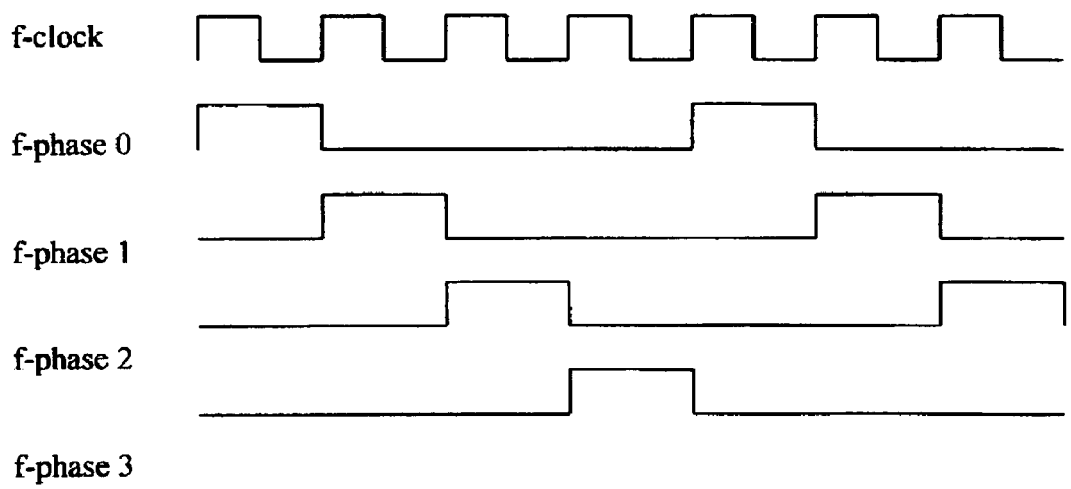
FIG. 8(b) is a diagram illustrating how an f-clock signal relates to f-phase signals.
Figure 9:
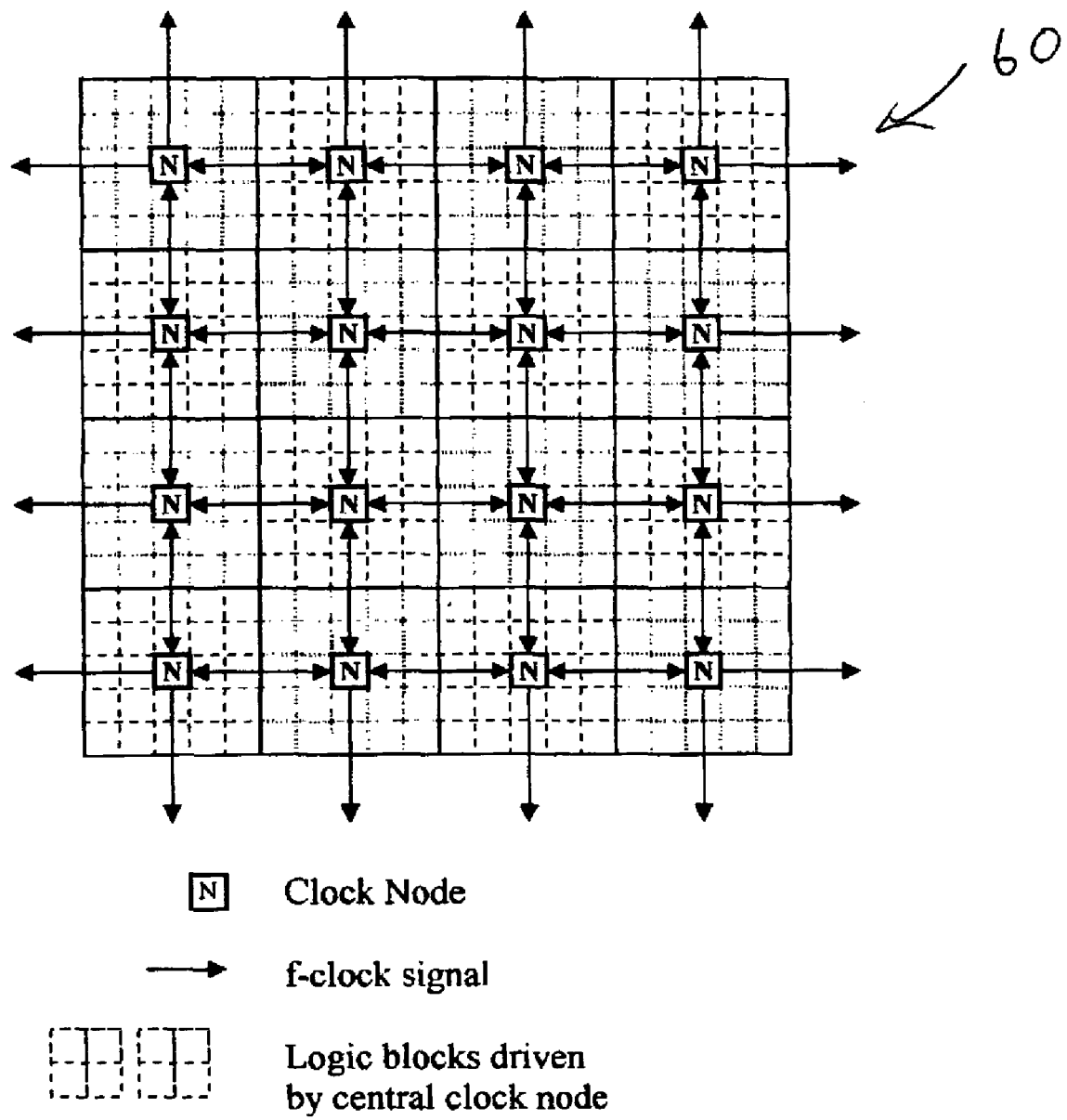
FIG. 9 illustrates schematically a mesh of sixteen clock nodes.

One alternative way of distributing the fabric clock reliably is to self time it locally and mesh-enable the oscillation. The present invention utilizes this technique. Such a system is made up of an array (or "mesh") 60 of clock nodes (see FIG. 9). One such clock node 50 is illustrated in FIG. 8(*a*).

In this node 50, the timing through delay D matches that in a standard LUT. The output of D is driven in all directions N,E,S,W to the surrounding clock nodes. The clock signal is also buffered to provide the fabric clock to the clock node's local LUTs.

Clock signals 51,52,53,54 are also received, in all directions, by the clock node 50 from adjacent clock nodes. The next oscillation in a node can only proceed when enabled by all the surrounding clock nodes. Therefore, the slowest adjacent clock node sets each clock node's frequency. Because the clock node 50 itself might have the slowest frequency, one clock signal N' is also driven out half way in an arbitrary direction and then routed back to itself.

Although self timed, there is an inherent overhead due to the extra delay associated with the NAND gate 55 and driving the load LUTs, which provides a safety margin.

In this way, in a steady state system all nodes have the delay of the slowest node. Any variation in the delay of the nodes will propagate one clock node hop each cycle. This is fine as long as the rate of variation can be absorbed in the clock overhead. A temporary dip in a power supply at one point will cause the timing circuit in that area to exhibit a longer delay, slowing the next clock period. The mesh will cause the four surrounding clocks to also be slow. Signals generated by circuits affected by the power dip will also be slow. As long as those signals are not latched by clocks that are outside of the immediately connected mesh then the slow signal will be matched to a slow clock.

Each clock node would drive its f-clock to a surrounding array of logic blocks through a grid or H-tree distribution scheme. Clock skew figures are minimised because the number of stages in the distribution chain is small and all clocks are local (extreme path differences of, say, a multilevel H-tree are eliminated).

The fabric clock signals are related to the system clock using a counter in each clock node 50 to count the number of fabric clock signals. Once the required number has been reached the next fabric clock is stopped until the rising edge of the system clock arrives. This then resets the counter and the fabric clock is enabled once more.

There is an alternative possible mode of operation: self-timed. Here, there would be no external system clock applied: the fabric clocks would instead cycle in their own time i.e. as fast a possible. Circuits would be designed to allow a task-based handshake system. This would be very power efficient: tasks would be completed and then the system and fabric clock network/mesh shuts down until the next task appeared.

Fabric Cycle Counter

At some point the fabric clock needs to control the fabric cycle count i.e. the f-clock needs to increment the TS value 0,1,2 and so on, that is applied in the form of fabric phase (f-phase) signals 0,1,2 and so on to the configuration memories to access the required configuration. FIG. 8(*b*) shows how the f-clock relates to the f-phase signals, f-phase 0-3. This can be done at a high level (e.g. in the clock nodes 50), or at a lower level such as inside the LB itself or even the LUT. In the present embodiment there is a counter in the LB to allow individual control over the count within each LB. This means that in a 16TS system there would be only one fabric clock input to the LBs, which is connected to a counter internal to the LB to create sixteen f-phase signals that are then distributed around the LB.

System Configuration

In such a TS scheme there are some basic points that can dictate the architecture:

1. the higher the TSV the higher the gate density possible
2. the higher the TSV the lower the overall frequency attainable
3. one LUT per fabric cycle would be a good starting point as it would enable a small signal circuit design: higher speed and lower power.

So, given these basic pointers, a complete fabric system can be built in the manner now described below.

Power Considerations

Achieving a higher logic density effectively reduces the area required for a given system. This in turn means that a lower standby (leakage) current is achieved. Also, as the LUTs themselves are denser, effective distance between them is smaller so there is the potential to save active power. However, is this saving due to density improvements sufficient to cover the extra power consumed in reading the configuration data in each fabric cycle? This question is answered by the following analysis.

Figure 10:
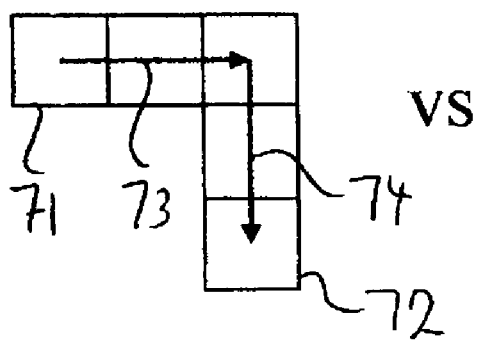
FIG. 10 illustrates schematically a 2by2 route connection between two logic blocks (LBs)
Figure 10:
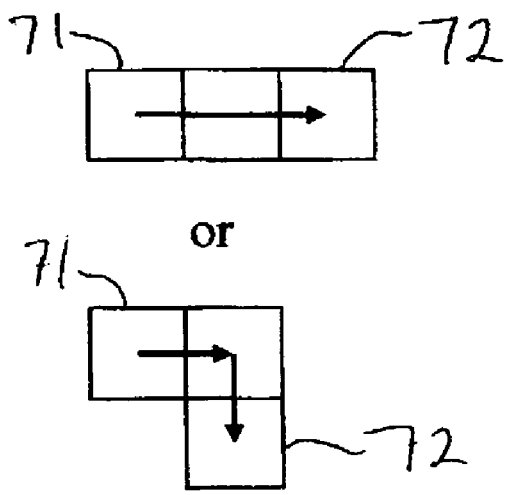

Assuming the TS scheme can increase density by four times, we can say that it would halve typical track lengths. Let us consider an average connection between two logic blocks (LBs) 71,72. In a standard scheme (not a TS scheme) this connection would be a "2by2 route" scheme i.e. made up of four logic blocks connected in two steps 73,74 (see FIG. 10). Total length is 240 $\mu m \times 2 = 480$ $\mu m$. In the TS scheme, with density increased by four times, the average route length between the same two logic blocks 71,72 is only two logic blocks (connected in either one or two steps—see FIG. 10). This would therefore save 240 $\mu m$ of track 'power'. Therefore, to save power reading the mux configuration data must take less power than driving 240 $\mu m$ of track.

In the TS scheme, the system clock is running TS times faster than the user clock. However, the clock has to be distributed over TS times fewer LBs.

What track equivalent power would reading and decoding the 4 bit mux data take? Basically, too much: SRAM cells provide a high load because they have two access transistors, which are gate connected. Also, a traditional SRAM cell has differential bit-lines which means that in an access a bitline always transits.

To select a 1 of 16 or 1 of 8 mux requires four or three cells and then a 4:16 or 3:8 decoder. Reading four traditional differential bit-line SRAM cells means driving four bitlines. Driving the wordlines of four cells uses quite a lot of power. Also the decoders themselves are very power hungry requiring many gate connections. Even using single ended bitlines (therefore halving the number that will move on average from four to two) causes power consumption way above the desired target.

One solution is to use an alternative memory technology. Flash eeprom cells are at least a quarter of the size of an SRAM cell e.g. a nor flash cell in 0.13 $\mu m$ is 0.4 $\mu m^2$.

This allows us to store the mux data in one-hot form, with just one bit out of a range set to 1, removing the need for a decoder. Flash cells also have much lower wordline capacitance because they only have one transistor and they also have much thicker oxides. Overall, estimates suggest that a read could be performed in around the same power as 210 $\mu m$ of track.

Flash is, of course, also non-volatile, a major advantage in that the FPGA would not require a separate boot PROM. Also, flash has very low leakage characteristics (i.e. potentially zero) compared with SRAM. However, there is the disadvantage that the circuitry could not be reconfigured on the fly e.g. to perform multiple tasks or to change its function to cope with a different mode of operation.

Another solution is to incorporate the decoder into the storage cells for the mux. In this way the number of storage cells is minimised and only one bit-line moves, which can be directly connected to the mux. The amount of gate driven by the wordline is also reduced. (See below for more details on the operation of the configuration memory.) Due to the added complexity and risk associated with a flash process, the preferred embodiment of the invention is built with the latter architecture.

Exploiting the Fabric Cycle Clock: Low Voltage Swing Scheme

In the preferred embodiment the fabric cycle clock is used as a power saving mechanism. One way to do this is to use a low voltage signaling scheme such a LVS (low voltage swing), sometimes referred to as LVDS (low voltage differential swing). See, for example, the scheme described at (ftp://download.intel.com/technology/itj/2004/volume08issue01/art04_lvs_technologyivol8iss1_art04.pdf).

Flip-flops in the LB inputs and buffers (e.g. Inputs, Buf0-7 in FIG. 2) driven by the fabric cycle clocks become sense-amplifiers to sense the small voltage input signal. For better noise immunity the signaling is differential. This is an ideal match to the TS scheme as the TS nature of the interconnect means that there is very low signal density between blocks, allowing more than enough room to double the number of signals for a differential scheme.

The high degree of structure in FPGAs also lends itself to LVDS systems: the restricted number of track types (by1, by2, by6. . . ) allow careful simulation of all possible combinations to be undertaken in confidence without the need to create complex EDA tools (as in Intel's solution).

An LVDs scheme saves power and creates less noise. Power is a square function of voltage, so a 67% reduction in swing leads to a 90% power saving.

Figure 11A:
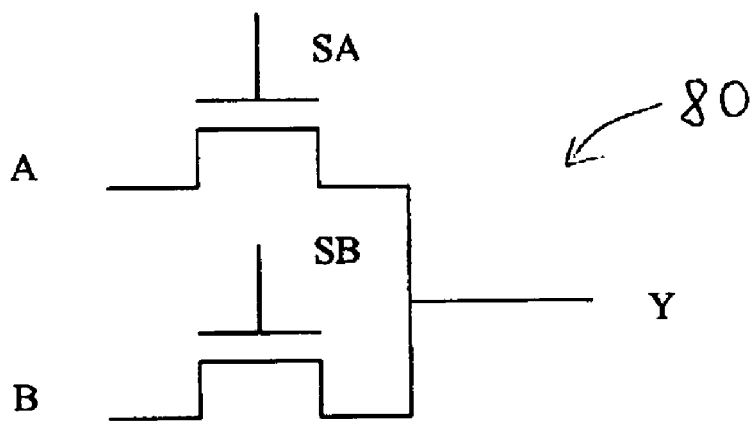
FIG. 11(a) illustrates a low voltage swing (LVS) 2:1 mux.
Figure 11B:
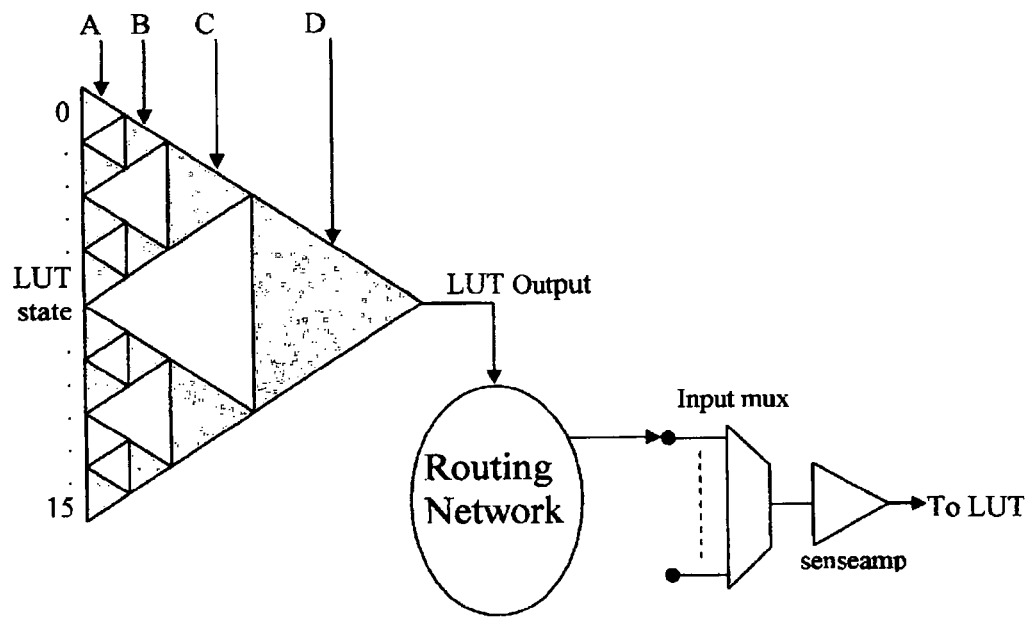
FIG. 11(b) is a representation of a typical signal path from an LUT to a senseamp via routing.

Implementation of LUTs and muxes is also much simplified. The true and complement halves of an LVS 2:1 mux 80 are implemented simply as shown in FIG. 11(*a*).

A LUT can be built up of a tree of such muxes; a LUT4 would be made up of four stages of 2:1 muxes, each stage selected by one of the inputs A, B, C, D to an LUT4 20 as in FIG. 4. A differential mux would require two copies of the structure, one for true and one for complement. Even so, such an LVDS mux has half the transistors of a CMOS mux and also has no PMOS devices, so area is saved as there is no wasteful well boundary.

LVDS is also very good at XORs, which are essential for arithmetic circuits. It is simply a matter of selectively swapping true and complement data.

Of course, routing muxes are already made of such structures; the whole path from LUT to sense amp via routing would go though NMOS pass gates in this way. This means that the signal flow from input on the gate of the LUT to output at the receiving senseamp is low swing. FIG. 11(*b*) shows a representation of a typical signal path.

Saving Power Architecturally

Alternative embodiments may employ different power saving techniques. For example, another way to save power in a TS scheme is to use temporal fanout. Consider a LUT configured as an AND-gate driving the select input of thirty two other LUTs configured as 2:1 muxes. In a standard architecture this would take thirty three LUTs and the select signal would have to span all of them, probably using multiple levels of routing, regardless of whether there was slack in the timing.

In a TS scheme, if there was slack in the timing the fanout could be undertaken in time as well as space. The thirty two LUTs could be folded into four fabric cycles with eight LUTs in each and the select signal would only have to span nine LUTs (or eight if one of them was folded over the driving LUT).

Implementation:
Two-Phase Routing Scheme

The LVDS scheme requires signal lines to be precharged/equalised. This means that there are two phases to the routing scheme: precharge/equalise and integrate. In order to maximise the data throughput, all routing must therefore be two phase: let us denote them as o and e, for odd and even. When phase e is in integrate, phase o is in precharge/equalise and visa-versa.

Precharge/equalise can be achieved in two ways:
1. The routes are precharged and equalised to Vss (the negative power supply voltage) or Vdd (the positive power supply voltage).
2. The true/complement of the routes are just equalised. A mid point is found somewhere (normally exactly half way) between the two signals.

Figure 12:
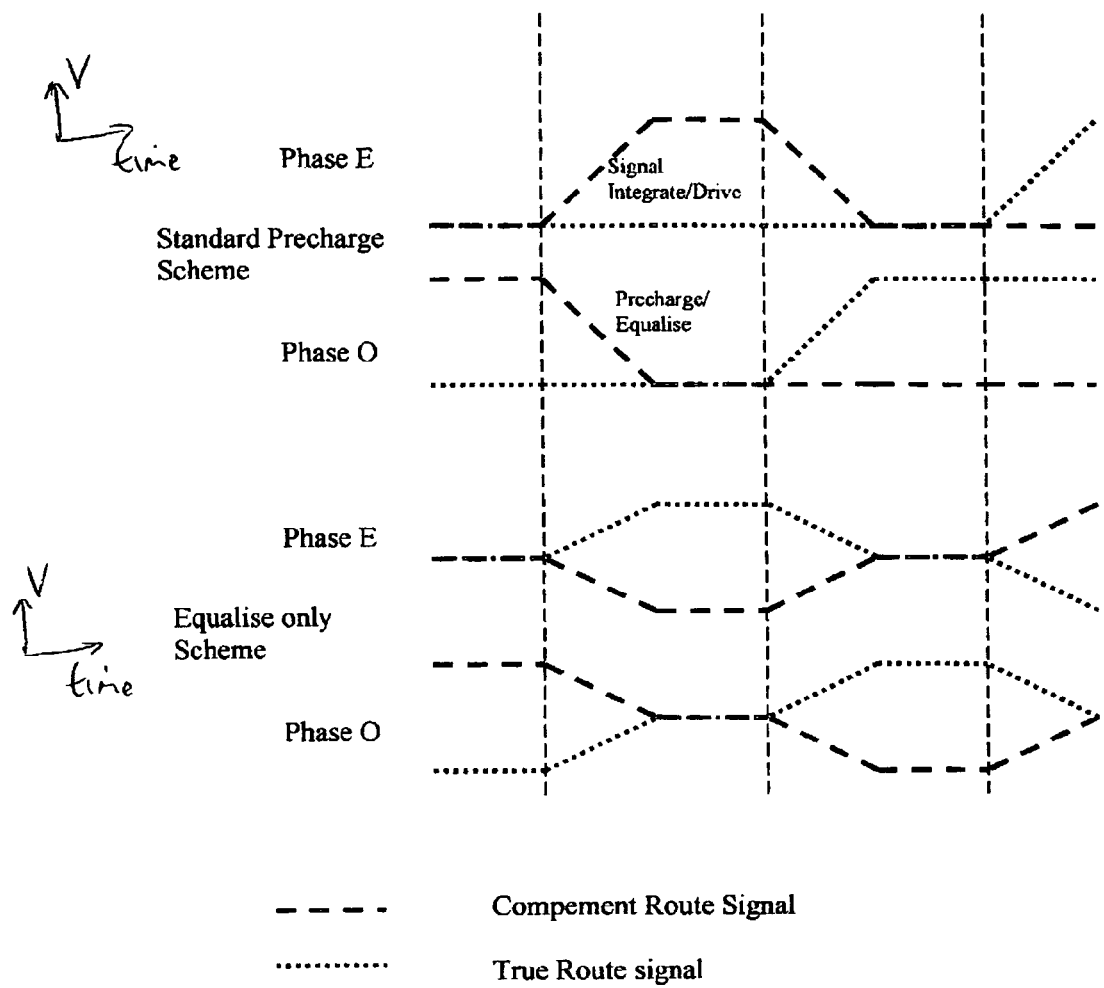
FIG. 12 shows graphs illustrating various signals in a two phase routing scheme, plotted as signal voltage on the vertical axis against time on the horizontal axis.

Both options are diagrammatically illustrated in FIG. 12 (where scheme 1 is illustrated by Phase E and Phase O in the upper graph and scheme 2 by Phase E and Phase O in the lower graph). The second "equalise only" scheme is more power efficient:
  Just a single equalise device is driven as opposed to 3 devices: 2 precharge and 1 equalise
  The voltage swing on the true and complement lines is halved, quartering the power per line and as there are two lines, halving the power overall.

At the end of the integrate phase the senseamp of the destination logic block input or buffer is fired. The senseamp's output is latched allowing the senseamp itself to be reset. It is important that the internal nodes of the senseamp are equalised or connected to the input routes during the equalise phase because otherwise the residual data in the senseamp can affect the result of the next senseamp fire.

The two phase routing scheme is linked in with the configuration memories 22,35 of the programmable logic circuit. The configuration memories are also split into two phases, so there is a memory for all odd fabric cycles and a memory for all even fabric cycles.

During equalisation of phase e, the next configuration for phase e is being read from phase e configuration memories. Moving the configuration memory bitlines is fairly slow, so is expected to take the whole fabric clock cycle. At the end of equalise, the new configuration is established: all the constituent routes are connected as the gates of the muxes have been enabled by their configuration memories and are equalised by the equalise devices.

Moving to the integrated phase, the equalise devices are turned off and signal is allowed to build on the route. During this time the active bitlines of all the even memories that make up the route stay high to maintain the route and ensure the signal can build.

At the end of the integrated phase the even memory bitline is pulled low and the senseamp is fired. Here there is a problem: we want to reset the old bitline at the same time as potentially starting to build the next bitline. A couple of solutions present themselves:

1. Split both the odd and even memories in two again so we have four memories that we can denote double even (de—0,4,8), single even (se—2,6,10), double odd (do—3,7,11) and single odd (so 1,5,9).
2. Self time the reset and only allow the new signal to build after reset has completed.

Four-Phase Routing Scheme

Figure 13:
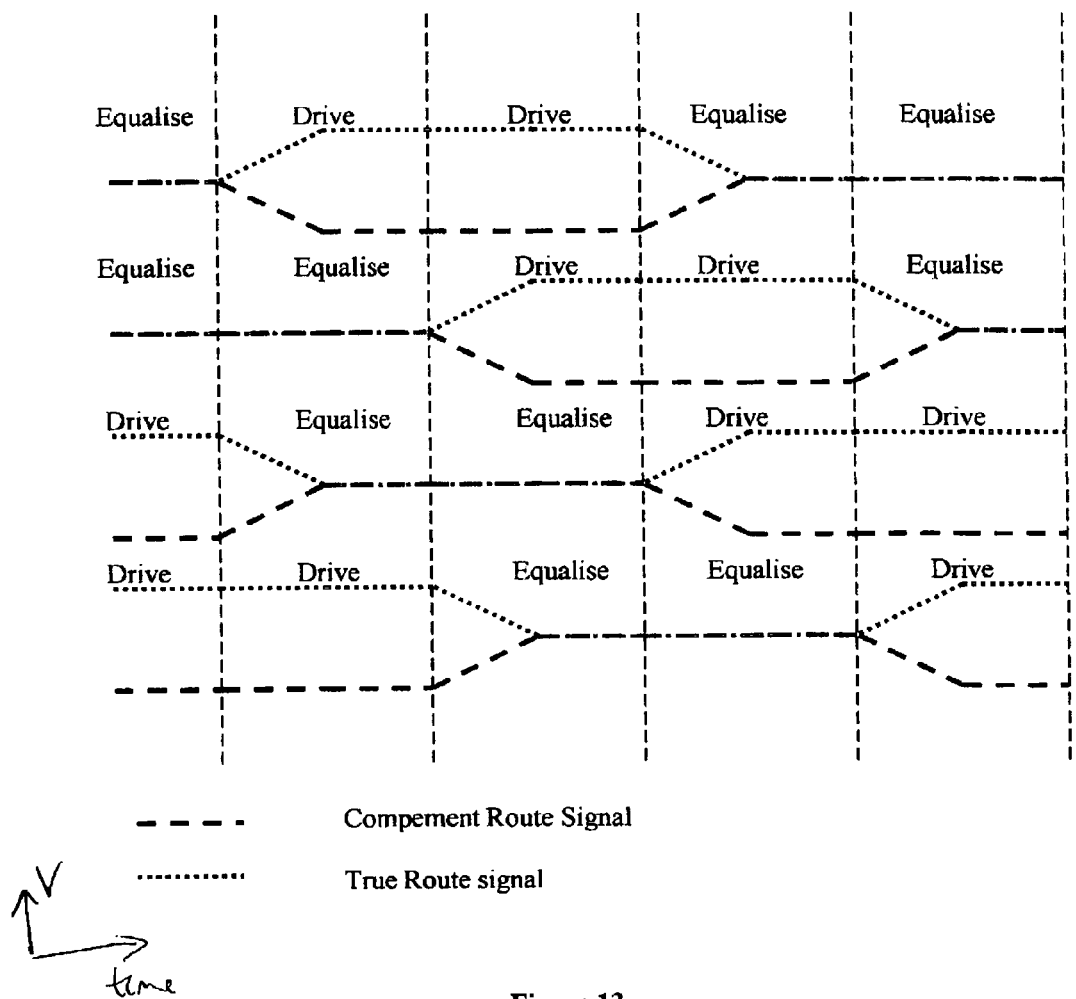
FIG. 13 shows graphs illustrating various signals in a four phase routing scheme, plotted as signal voltage on the vertical axis against time on the horizontal axis.

An alternative approach is to use a four-phase routing scheme as illustrated in FIG. 13 which is a plot of voltage vs. time. Such a scheme offers the following advantages and disadvantages:

Advantages:
   Plenty of time to reset the senseamp
   No need to combine the single/double even or single/double odd signal paths together, increasing speed.

Disadvantages:
   Doubling the number of routes over the two-phase scheme.
   Doubling the LUT circuitry: need a LUT for each phase.

In practice, if there is not enough space to include all the routes, extra metal layers may be needed which may be problematic. Also, doubling the LUT circuitry will be a problem if the area taken by the LUT circuitry is significant in the context of the whole logic block.

The Input and Routing Configuration Memories

Figure 14:
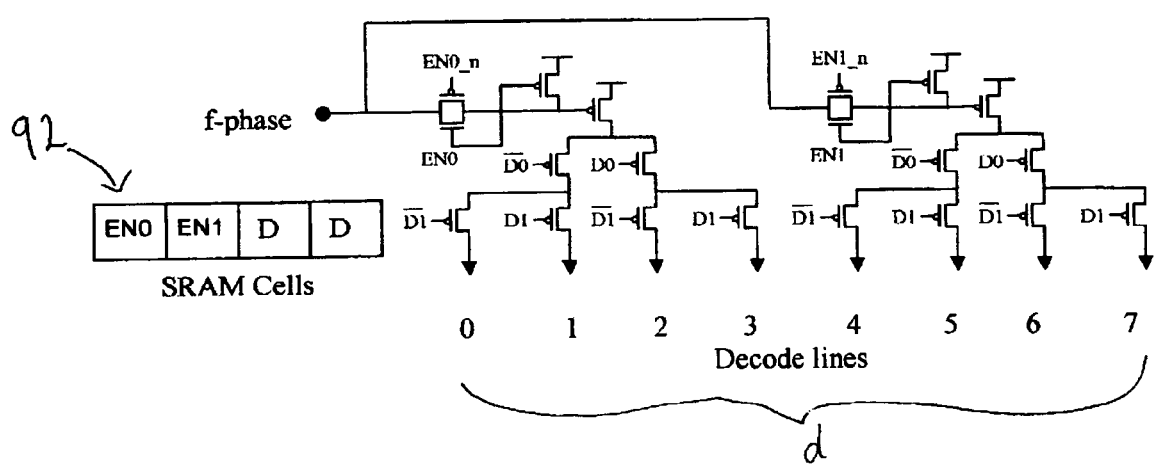
FIG. 14 is a diagram of basic circuitry in an input configuration memory row.

These configuration memories 25 (described in the earlier section headed "Time shared Inputs") are extremely important elements of the architecture as they consume a large part of the area. FIG. 14 shows the basic circuitry in one input configuration entry, or row.

Decoder Method: For Routing Without Sense Amplifier (SA)

In this technique a decoder having eight decode lines d0-d7 is used to select the path through the input mux 10. With reference to FIG. 14, the encoded data EN0, EN1 is stored in a row 92 of the memory and then a decode tree selects which decode line of the eight decode lines d will be activated on the basis of the data they contain. The decode tree takes the true and complement versions of the content of cells D0 and D1 (of the row 92 of the memory) to produce d0-d3 and d4-d7 which are enabled by EN0 and EN1 respectively. In this way the amount of state is minimised but only one decode line is activated.

The decode lines d must be precharged low, and then when accessed the precharge is released and the selected decode line rises. Unselected decode lines remain low, but are not held low i.e. are floating low. (This is acceptable as they are not in this state for long and coupling mechanisms are ruled out by simulation.)

Decode line precharge is controlled by the configuration entry using further select lines, that can be decoded in the same way as the decode lines.

Figure 15:
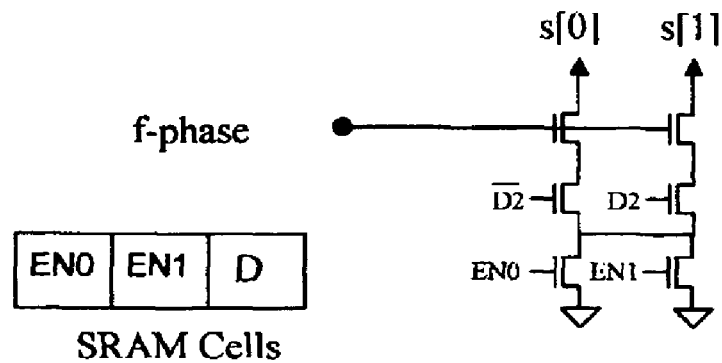
FIG. 15 illustrates select line generation in an embodiment utilising a decoder.
Figure 16:
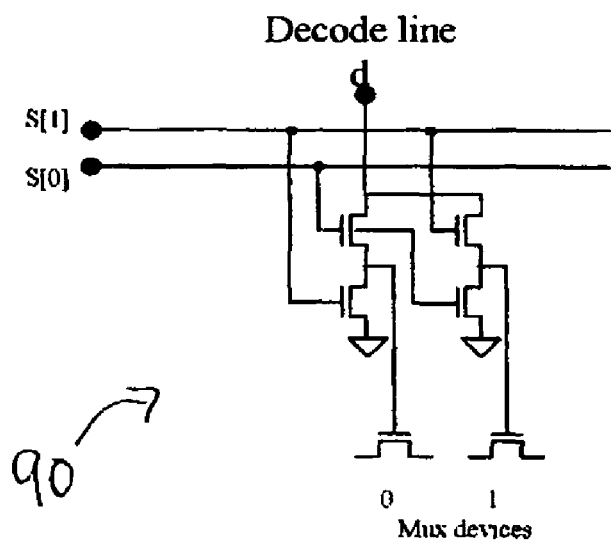
FIG. 16 illustrates an embodiment having multiple select lines.

FIG. 15 illustrates the select line generation. The select line and decode line generating circuits combine to create a configuration entry, with one entry per f-phase. Here the select lines are precharged high. If selected by the cell D2 of the memory row 92, the line discharges to ground. Having multiple select lines allows them to de-multiplex one decode line to multiple mux selector transistors. Such a demultiplexing circuit, or demux 90, is illustrated in FIG. 16 where if select line s[0] is high one mux device 0 is selected, and if the other select line s[1] is high a different mux device 1 is selected. In the default precharged state both s[0] and s[1] are high, but this is valid as the decode lines d[7:0] will not be high in that situation. The disadvantage of this demux circuit is that the voltage on the demux is reduced from full Vdd (positive supply voltage) to Vdd−Vtn, where Vtn=turn on threshold of nmos device i.e. the voltage needed on the gate for the device to start to turn on.

Figure 17A:
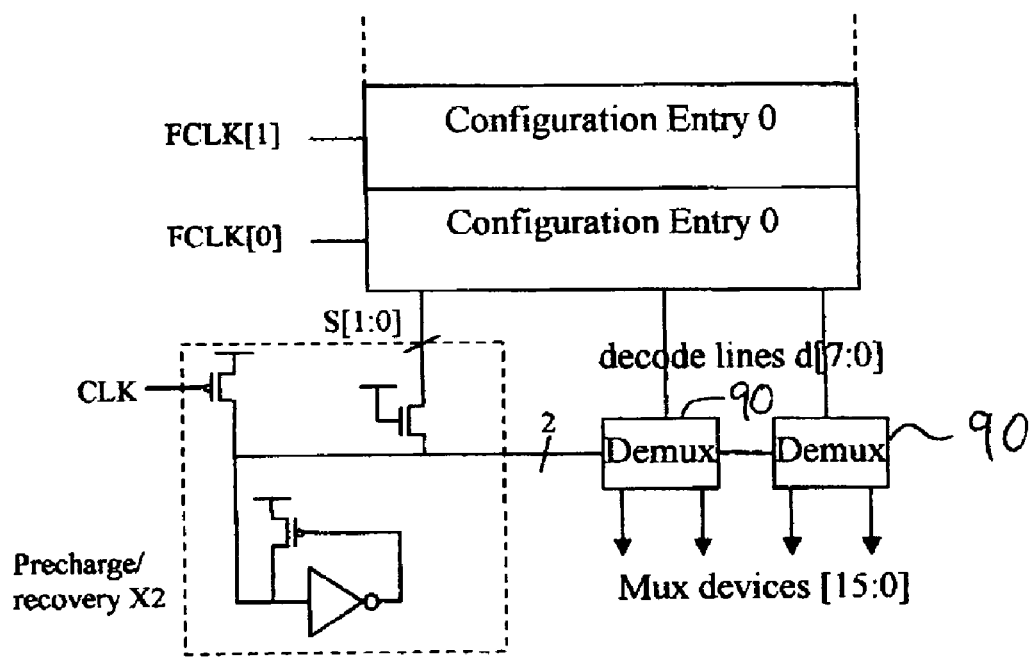
FIG. 17(a) is a diagram of a top-level configuration memory.

The top-level configuration memory is as shown in FIG. 17(a) (the other circuits, FIGS. 14-16, are sub-circuits of the top-level memory of FIG. 17(a)). Various steps can be taken to ensure the power consumption of this design is minimized such as, for example:

The select lines s[1:0] can be duplicated: enabled by en0 for the left half of the decode lines d[3:0] and by en1 for the right half lines d[7:4]. This means only half of the demuxes 90 like that shown in FIG. 16 are driven—the half which are going to see an active decoder line.

The demuxes can be directly connected to the select lines s[1:0]. This limits their swing to Vdd−Vtn down to ground, saving power. However, this also slows speed at which the mux devices are activated.

Figure 17B:
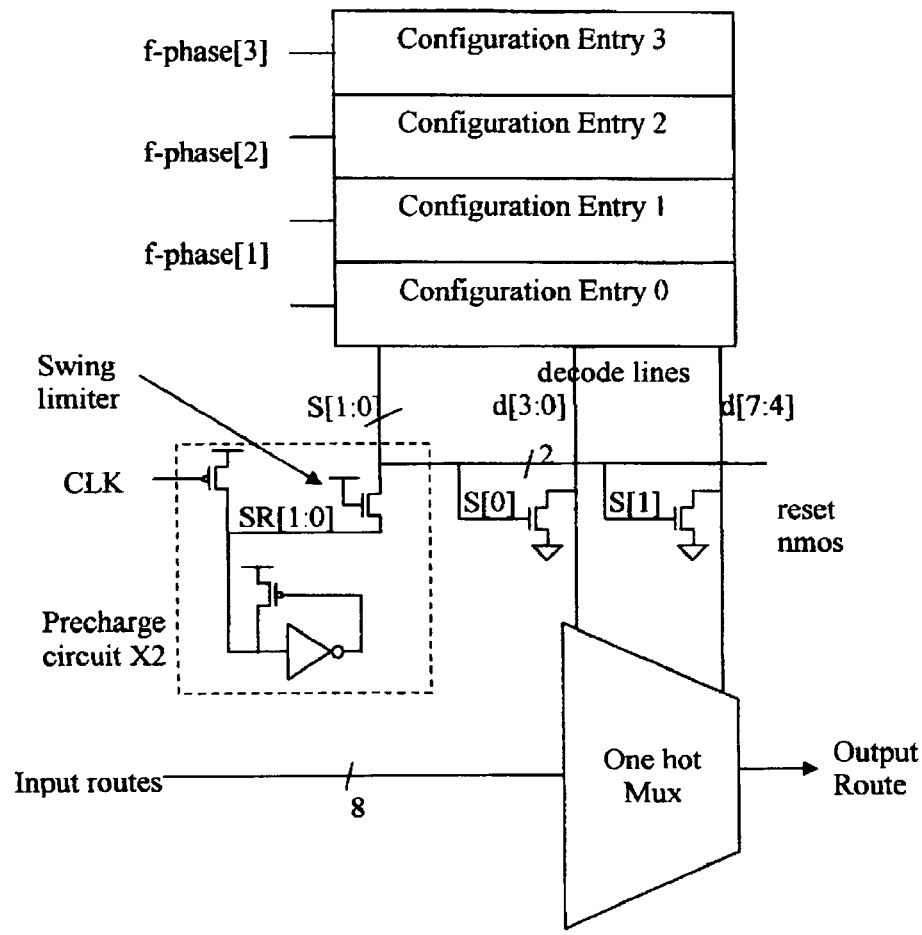
FIG. 17(b) is a diagram illustrating an alternative top-level route configuration memory.

An alternative solution is to double the number of decode lines instead of using demultiplexers and just have one select line: simpler, but it uses more area. This method could also be used in smaller muxes e.g. 8:1. A top-level route configuration memory with this arrangement is show in FIG. 17(b).

Decoder Method: For Buffers and Inputs

Figure 18:
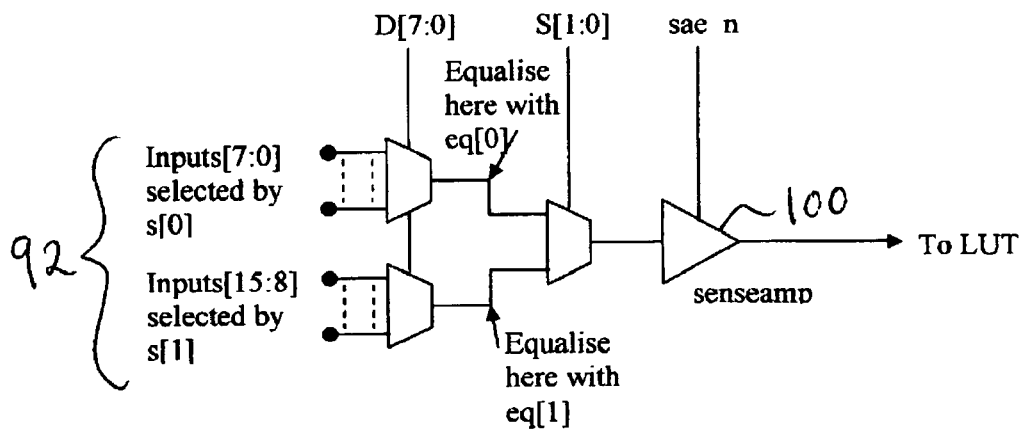
FIG. 18 is a diagram showing a sensamp used with various circuit inputs.

LUT Inputs and buffers have senseamps to detect the routed signal. This is illustrated in FIG. 18. The senseamp 100 (hereinafter referred to as "the SA") can be controlled by the configuration memory: the SA is only fired when the configuration memory is reading an enabled entry. The senseamp enable signal sae_n triggers the senseamp 100. The senseamp also needs to be isolated from the input signals 92 to prevent the small swing input from being driven by the senseamp itself, wasting power. The decode lines D[7:0] can act as a first mux stage select and the select signals s[1:0] as the isolation signals and the second mux stage select.

The circuit shown in FIG. 19(a) (hereinafter referred to as the sae_gen circuit) generates the active low sense amp enable signal sae_n. The configuration memory also controls the equalise signals from the sae_gen circuit. Equalise only occurs when the memory is accessed. But equalise is needed to be released so that the signal can integrate freely, so CLK1, which is the opposite phase clock (i.e. if CLK0 is the even phase clock, CLK1 is the odd phase clock), is used to cancel the equalise signal. The equalise is applied to the mid stage of the mux, so there are two equalise signals: eq[0] for the half of the mux selected when s[0] is enabled, and eq[1] for the half when s[1] is selected.

The following further power reduction methods can be applied:

The equalize NOR gates 101,102 can be connected to the limited swing select lines if a supply voltage of around Vdd−Vtn is available The respective select line isolation NMOS 103 for each equalize signal, with its gate connected to vdd, can be gate connected to a lower supply (e.g. 0.8V when Vdd is normally 1.2V) to limit the swing of the select lines s[1:0].

A top level diagram of the input configuration memory is shown in FIG. 19(b).

A timing diagram of these control signals in a four phase routing scheme as shown in FIG. 20 which is a plot of voltage vs. time.

Static Method

An alternative approach which may be used in other possible embodiments is to use static configuration memory. The advantage of a static configuration memory would be that if it did not have to change, no power would be wasted in precharging and reevaluating. Such schemes revolve around a cell that can drive either a high or a low. The configuration memory cell 110 shown in FIG. 21 can drive a 0 or a 1

(Vdd–Vtn) onto the read bitline (rbl_t). It uses three extra transistors over the standard 6T SRAM cell: a 50% increase in area is expected.

In a static solution, the output of the configuration memory is held to be reused in subsequent f-cycles if needed. The FPGA manufacturer's place and route software will target such input reuse as a power saving mechanism. To make this work, the read wordline needs to be held high for as long as the output is held. To do this we need to hold the enabled wordline using a latch until another enabled wordline in the same mux-mem is activated, selecting an alternative output.

FIG. 22 (a) shows a 4 entry configuration memory entry latch. The latch is set by the f-phase input if the entry is enabled i.e. holds a valid configuration. The resulting read wordline output, rwl, reads the data from the static cells and also resets the enable and on the other entries, causing their rwl signals to go low. Similarly, on the next f-cycle, if the f-phase$_{n+1}$ entry is enabled it will send its rwl signal to reset this f-phase$_n$ entry. FIG. 22(b) shows how the complete configuration memory entry is arranged with the latch 107, the enable cell 108 and the static data cells Cell0, Cell1, Cell2, Cell3.

The sae_gen circuit of FIG. 19 needs to be adapted for the static solution as shown in FIG. 23(a). In this static scheme sae_n goes high due to clk0_n going low or one of the active low select lines s_n[1:0] going low. At the end of the access, when the sense is to be fired sae_n goes low due to clk1_n rising. If the next cycle also accesses the configuration memory, the falling edge of sae_n is shortly followed by it rising again due to the new access, effectively creating a pulse on sae_n. The equalization of the senseamp and input route can start immediately after sae_n rises in the second half of the equalize cycle. The eq signals now have to be only activated just prior to the input signal being driven to prevent inadvertently equalizing other signals that may be using a particular route, via the static selected input path. The senseamp must be followed by a data capture circuit, such as a precharged arrangement, so that the sensed data is not lost.

FIG. 23(b) shows a top-level diagram of the static input configuration memory.

Combining Ideas

The biggest problem with the static solution is the overall size of the row entry. We can combine a static solution with a decoder to reduce the row entry's area. This is illustrated in FIG. 25 showing a data cell 118 in which the decoder section 120 (circled) is static and integrated with the cell. Another copy of the decoder is connected to the data_t[0] node to create the full 2:4 decode. Another data cell, which is not shown, provides the second data inputs data_t[1] and data_c[1]. The area of the decoder 120 is approximately the same as the data cell, being eight transistors 121-128, all NMOS except one 121, making layout easier. The remaining PMOS 121 can also be converted to NMOS with its gate connected to data_t[0] if timing (determined by simulations) allows.

Timing Diagram

The timing of the static circuit in a two-phase implementation is illustrated in FIG. 26. The f-phase signals, which drive the read wordlines of the configuration memories, trigger an access. The select lines s[x], s[y] and decode lines d[x] and d[y] rise according to the contents of the row addressed. The falling edge of clk0_n causes eq and sae_n to rise as there is a valid access: one of the s lines is active. When sae_n goes high, it resets the senseamp (SA) nodes and the input signal nodes and senseamp nodes are equalized by eq. When clk0_n rises, eq goes low, but sae_n remains high because clk1_n is now low. The input signal is now free to integrate on the senseamp inputs. The rising edge of clk1_n causes sae_n to fall and the senseamp to fire, amplifying the input signal.

If the next cycle addresses a valid row, the select lines will remain the same or a new one will select and the old one deselect. The falling edge of clk0_n in new cycle causes the sae_n and eq signals to rise, resetting the senseamp and beginning the process once more. The output of the senseamp only needs to be valid for a short period, because they drive a precharged decoder structure: as long as the precharged structure has enough time to discharge, the data is captured.

The Senseamp

FIG. 27 illustrates a Senseamp circuit 130, for use in the invention. This circuit configuration is often used in SRAMs (but usually with the NMOS and PMOS transposed). The incoming differential input signal from the input mux is passed to the internal nodes 134 of the senseamp latch 135. The senseamp is fired using the PMOS device 137 and the second stage input multiplexer devices in the configuration memory are simultaneously shut by the select lines s[1:0] to prevent the full rail signal generated after the senseamp fires propagating back to the route. The cross-coupled PMOS 136 and NMOS 138 in the senseamp provide a high gain amplifying stage. The most important devices are the cross-coupled PMOS 136: these must be closely matched to reduce input offset.

The LUT Architecture

The LVDS scheme of a LUT4 can look like the diagram shown in FIG. 28 which shows a four input LUT tree 140. Each triangle, or stage, is a 2:1 mux controlled by the vertical inputs A,B,C,D. Internal LUT nodes connect the LUT stages together (the LUT nodes are referred to later below: they are basically at the tips of the triangles in FIG. 28). The disadvantage of this scheme is that there are a large number of series source connected devices from the LUT data to the output. Also, the A input will see a large amount of gate as it is connected to sixteen muxes (true and complement).

LUT Decoder

An alternative possible architecture is to use a decoder in the input path, as illustrated in FIG. 29. The two input, four output LUT decoders 150, 152 take the outputs of the senseamps and drive the LUTs with decoded lines to select the correct output data. This reduces the number of stages in the four input LUT from 4 to 2. Each stage is now a 4:1 mux instead of a 2:1 mux. An implementation of the decoder and LUT multiplexers from FIG. 29 is illustrated in FIG. 30. The advantage of using a decoder is that the number of transistors in the path from the LUT data to the LUT output is reduced from 4 to 2, allowing the small signal output to build more rapidly. Other decoder structures could be used, for example a four input sixteen output decoder would reduce the LUT to a single stage sixteen select input one hot mux.

The LUT Architecture:
LUT Buffering

One buffer is provided for each input A, B, C and D to each LUT in all four phases. The number of buffers can be varied: fewer buffers save area but can compromise the routing of the circuit, more buffers make implemented circuits easier to route, but add area. Buffers have a number of functions, ranked in significance as follows:

1. To provide extra state storage so correct circuit connectivity can be mapped (as already discussed)
2. To provide extra inputs as needed e.g. in LUT3s.
3. To route to state points in the configuration of muxes and super-LUTs. (State points, discussed in more detail later below, are the LUT configuration state nodes that are the output of the LUT configuration memory.)

Buffer connectivity has already been described above. An explanation of the reasoning behind the design choices made is now given as follows.

The principle role of the buffers is to provide state storage to enable all circuits regardless of connectivity to be mapped to the fabric. A buffer must be able to route to all other phases of its associated input. For example in a 4 phase routing scheme where the phases a denoted p, q, r and s the buffer for lut[0] input d, d[0] as shown in FIG. 31 (showing an LUT arrangement within a logic block), in phase p must be able to connect to d[0] in phases p (i.e. its own input), q, r and s.

Similarly, sometimes inputs receive a value and that value needs to be used in the same input in the next phase. One method to deal with this is to send to an input and a buffer in the first cycle, then the input in the next cycle gets the value from the buffer. Alternatively, the input can receive data from the output of the input senseamps from the previous phase, if that connection is available on the input mux. This is preferable as it saves power: just two senseamps are fired instead of three.

LUT Fan-Out Buffering

Buffers attached to the A LUT inputs (bufa[3:0]) in the LB have the ability to fan-out to other LUTs in the LB: these are known as fan-out buffers. The fan-out buffers may have their own state storage. Every input can either see a fan-out buffer that connects to one other LUT or to the other three LUTs within the LB.

The below Table 2 defines the sources of the fan-out buffer signals:

TABLE 2

| LUT BUFFER A | FAN-OUT SIGNAL |
|---|---|
| 0 | buffo4[0] |
| 1 | buffo2[0] |
| 2 | buffo2[1] |
| 3 | buffo4[1] |

How these signals connect to the inputs A,B,C,D is defined in Table 3 below:

TABLE 3

| LUT | A | B | C | D |
|---|---|---|---|---|
| 0 | buffo4[0] | buffo2[0] | buffo2[1] | buffo4[1] |
| 1 | buffo4[0] | buffo2[0] | buffo2[1] | buffo4[1] |
| 2 | buffo4[0] | buffo2[1] | buffo2[0] | buffo4[1] |
| 3 | buffo4[0] | buffo2[1] | buffo2[0] | buffo4[1] |

So, the signal buffo4[0], which comes from bufa[0], can fan out to all four A inputs in the LB. Similarly, buffo2[1] which comes from bufa[2] can connect to C of luts 0 and 1 and B of luts 2 and 3.

Buffer Summary

The buffer architecture is summarized in the diagram shown in FIG. 32 which shows an example embodiment of the input multiplexer and senseamp and buffer multiplexer and senseamp. One of the inputs to the input multiplexer comes from the buffer state. Half of the buffer multiplexer provides inputs to the buffer state, the senseamp. The other half provides inputs to the mux extensions (see below for more details).

LUT Extensions

A number of features can be made available via a LUT extension mux such as, for example, Extended Lookup Tables.

Extended Lookup Tables

We can add LUT hierarchy so that the adjacent LUTs can be combined. This is illustrated in FIG. 33 in which the circled 4:1 mux extension 200 is added to enable larger LUT structures to be produced. Here, four LUT4s are combined with the mux extension 200 to produce a LUT6. The LUT outputs LUT0, LUT1, LUT2, LUT3 are connected to the mux data inputs Da[3:0] via the buffers attached to LUT inputs A-D in the current integrating phase. The mux selection signals come from buffers from the previous driving phase.

Partial Lookup Tables

Many large logic functions e.g. beyond four inputs, use the extra inputs as enables that are governed by one or perhaps two signals. This can be implemented as a partial logic tree i.e. circuitry does not need to be provided for a full logic cone (tree) if one section (branch) of the cone will always return the same value (0 or 1).

The infrastructure with reference to FIG. 33 can also be used to provide partial tree logic. To do this we must add 0 and 1 as inputs to the buffer mux in the bypass (rather than senseamp latch) path. This will allow the mux data inputs Da[3:0] to be connected to 0 or 1 and act as state values for a partial LUT.

Multi-level Extended LUTs

This idea can be extended across multiple mux 4:1 structures, as shown in FIG. 35. This produces an enlarged partial tree. For timing reasons it is proposed that this is the largest permitted structure.

Note On Extended Partial LUTs

Extended partial LUTs should not be confused with chaining LUTs together. Chaining of LUTs implies a connection from the output of one LUT to the input of another i.e. to the A, B, C or D inputs, not the LUT state point. However, the same effect can be produced by considering the combined gates as a single, enlarged complex gate which can be mapped to the partial tree LUT structure. In some configurations, multiple connections to LUT state points may be required which implies multiple LUTs connected to the mux data inputs Da[3:0] in single and/or double extensions.

Muxes

The mux extension can be utilized as a 4:1 mux. Input and output resources within the LUT permitting this can be done in parallel (in the same LUT) as a LUT4.

Mux Extension as LUTs

The mux extension can be configured as a LUT. The 4:1 mux can act as a LUT2 by driving the mux data inputs Da[3:0] to the appropriate 0/1 values. It can also act as a 3 input mux-lut, equivalent to a LUT3, by connecting a signal to one or more mux data inputs Da[3:0] pins in the manner now described.

Mux Extension Summary

The extension mux can be used in the following modes:
1. Full LUT5/6 extension: all applicable Da[3:0] pins connected to other LUTs
2. Partial LUT5/6 extension: Da[3:0] connected to the required combination of binary state or other LUTs
3. Full and partial versions of LUT7/8 by cascading two extension muxes
4. As muxes: 2:1, 3:1, 4:1 and 5:1 through to 16:1 by cascading.
5. As LUT2 by connecting Da[3:0] to binary state.
6. As mux-LUT3 by connecting Da[3:0] to binary state and/or a third input.

Feature and Input Selection

Many of the features described show multiple paths either from a LUT node to an output or from an input to a LUT node. How is the selection between the available paths dealt with?

It is desirable to minimise the number of transistors on the path from input to senseamp as this can have a profound impact on the speed of signal integration on the route. With this in mind input duplication is the best solution. For example in FIG. 33 there are two possible connections to Out0: one from the LUT4 output LUT node and one from the LUT5 output LUT node. FIG. 34 shows how, by enabling the correct select lines either a LUT4 or a LUT5 can be connected to Out0. If a LUT4 is required, the LUT4_enable signal is set to 1 and the LUT5_enable set to 0. This allows the LUT input D to select either the most significant (bits 15 to 8) or least significant (bits 7 to 0) of the LUT configuration data. If the input LUT5_enable is set to 1 and conversely LUT4_enable is set to 0, an alternative path exists where the LUT4 is again created but it connects to a further selection stage where the buf_t/c inputs act as a fifth LUT input to create a LUT5. The final LUT5 selection transistors connect to the output Out0.

LUT Configuration Memory

The LUTs are reconfigured on every f-cycle. To save power it is advantageous to not have to re-read the memory and have bitlines moving if the next configuration of the LUT is the same, or partially the same as the previous configuration. To this end a static solution is best: the outputs of the configuration memory are only changed if required.

A cell like that used in the static mux-mem of FIG. 21 is ideal for a static LUT configuration memory.

The invention claimed is:

1. A programmable logic circuit comprising a plurality of logic elements, a plurality of interconnect means, and static configuration memory means for storing the configuration of the logic elements and interconnect means, wherein said static configuration memory means is formed and arranged to store a multiplicity of different configurations for each said logic element, the static configuration memory means and interconnect means further comprising decoders, programmable logic further comprising means for converting a system clock signal to be applied to the programmable logic circuit into a modified clock signal comprising a predetermined number of sub-cycles for each system clock cycle.

2. The programmable logic circuit of claim 1, wherein the static configuration memory means is formed and arranged to store a multiplicity of different configurations for each said interconnect means.

3. The programmable logic circuit of claim 1, wherein the plurality of logic elements and the plurality of interconnect means are programmable.

4. The programmable logic of claim 3 wherein the interconnect means comprises interconnect blocks.

5. The programmable logic circuit of claim 4 wherein each different stored configuration for each said interconnect block is associated with a respective sub-cycle number and the programmable logic circuit is formed and arranged to address the static configuration memory means storing the configuration of the interconnect blocks by a fabric phase signal related to the sub-cycle number in order to read the configuration of said interconnect block associated with that sub-cycle and configure the interconnect block accordingly for that sub-cycle.

6. The programmable logic circuit of claim 3 wherein the logic elements comprise look up tables.

7. The programmable logic circuit of claim 6 wherein the look up tables comprise a storage memory with an entry for each sub-cycle that provides the look up table configuration for that sub-cycle.

8. The programmable logic circuit of claim 3 wherein the programmable logic circuit further comprises buffer means.

9. The programmable logic circuit of claim 8 wherein the buffer means comprises one or more extra storage registers per look up table.

10. The programmable logic circuit of claim 1 wherein each sub-cycle is allocated a number and each different stored configuration for each said logic element is associated with a respective sub-cycle number.

11. The programmable logic circuit of claim 10 wherein the programmable logic circuit is formed and arranged to address the static configuration memory means storing the configuration of the logic elements and interconnect means by a fabric phase signal related to the sub-cycle number associated with a particular configuration, in order to read that configuration and configure the associated logic element accordingly for that sub-cycle.

12. The programmable logic circuit of claim 1 wherein the modified clock signal comprises a multiplicity of clock nodes which are distributed across the fabric of the programmable logic circuit.

13. The programmable logic circuit of claim 1 wherein the programmable logic circuit is configured such that the modified clock signal is used as a power saving mechanism.

14. The programmable logic circuit of claim 13 wherein the power saving mechanism comprises a low voltage signalling scheme such as Low Voltage Swing.

15. The programmable logic circuit of claim 1, wherein the decoders are configured to limit a number of configuration bits required by programmable logic.

16. A method of operating a programmable logic circuit comprising a plurality of logic elements, a plurality of interconnect means, and a static configuration memory means for storing a configuration of the logic elements and interconnects, the static configuration memory means and interconnect means further comprising decoders, and means for converting a system clock signal applied to the programmable logic circuit into a modified clock signal including a predetermined number of sub-cycles for each system clock cycle, the method further comprising storing a multiplicity of different configurations for each said logic element in said static configuration memory means.

17. The method of operating a programmable logic circuit in accordance with claim 16 wherein a multiplicity of different configurations for each said interconnect means are stored in said memory means.

* * * * *